United States Patent
Campolo et al.

(10) Patent No.: US 7,049,910 B2
(45) Date of Patent: May 23, 2006

(54) CIRCUIT INTERRUPTING DEVICE WITH RESET LOCKOUT AND REVERSE WIRING PROTECTION AND METHOD OF MANUFACTURE

(75) Inventors: Steve Campolo, Malverne, NY (US); Nicholas L. Disalvo, Levittown, NY (US); William R. Ziegler, East Northport, NY (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 348 days.

(21) Appl. No.: 09/812,288

(22) Filed: Mar. 20, 2001

(65) Prior Publication Data

US 2002/0071228 A1    Jun. 13, 2002

Related U.S. Application Data

(63) Continuation-in-part of application No. 09/379,138, filed on Aug. 20, 1999, now Pat. No. 6,246,558, which is a continuation-in-part of application No. 09/369,759, filed on Aug. 6, 1999, now Pat. No. 6,282,070, which is a continuation-in-part of application No. 09/138,955, filed on Aug. 24, 1998, now Pat. No. 6,040,967.

(51) Int. Cl.
*H01H 73/00* (2006.01)

(52) U.S. Cl. .......................... 335/18; 335/172; 361/42
(58) Field of Classification Search .................. 335/6, 335/16, 18, 165–176, 202; 361/42–51
See application file for complete search history.

(56) References Cited

U.S. PATENT DOCUMENTS

| | | |
|---|---|---|
| 3,309,571 A | 3/1967 | Gilker |
| 3,538,477 A | 11/1970 | Walters et al. |
| 3,702,418 A | 11/1972 | Obenhaus |
| 3,731,154 A | 5/1973 | Torosian |
| 3,846,649 A | 11/1974 | Lehman et al. |
| 3,872,354 A | 3/1975 | Nestor et al. |
| 3,949,336 A | 4/1976 | Dietz |
| 4,002,951 A | 1/1977 | Halbeck |
| 4,034,266 A | 7/1977 | Virani et al. |
| 4,034,360 A | 7/1977 | Schweitzer, Jr. |
| 4,063,299 A | 12/1977 | Munroe |
| 4,086,549 A | 4/1978 | Slater et al. |
| 4,223,365 A | 9/1980 | Moran |
| 4,237,435 A | 12/1980 | Cooper et al. |
| 4,316,230 A | 2/1982 | Hansen |

(Continued)

FOREIGN PATENT DOCUMENTS

AU        759587        7/2003

(Continued)

*Primary Examiner*—Lincoln Donovan
(74) *Attorney, Agent, or Firm*—Paul J. Sutton

(57) ABSTRACT

Resettable circuit interrupting devices, such as GFCI devices, that include reverse wiring protection, and optionally an independent trip portions and/or a reset lockout portion are provided. The reverse wiring protection operates at both the line and load sides of the device so that in the event line side wiring to the device is improperly connected to the load side, fault protection for the device remains. The trip portion operates independently of a circuit interrupting portion used to break the electrical continuity in one or more conductive paths in the device. The reset lockout portion prevents the reestablishing of electrical continuity in open conductive paths if the circuit interrupting portion is non-operational, if an open neutral condition exists or if the device is reverse wired. Methods for ensuring a reset lock out state before shipment are provided.

6 Claims, 25 Drawing Sheets

U.S. PATENT DOCUMENTS

| | | |
|---|---|---|
| 4,442,470 A | 4/1984 | Misencik |
| 4,521,824 A | 6/1985 | Morris et al. |
| 4,567,456 A | 1/1986 | Legatti |
| 4,574,260 A | 3/1986 | Franks |
| 4,578,732 A | 3/1986 | Draper |
| 4,587,588 A | 5/1986 | Goldstein |
| 4,595,894 A | 6/1986 | Doyle et al. |
| 4,630,015 A | 12/1986 | Gernhardt et al. |
| 4,631,624 A | 12/1986 | Dorak et al. |
| 4,719,437 A | 1/1988 | Yun |
| 4,802,052 A | 1/1989 | Brant et al. |
| 4,851,951 A | 7/1989 | Foster, Jr. |
| 4,901,183 A | 2/1990 | Lee |
| 4,967,308 A | 10/1990 | Morse |
| 4,979,070 A | 12/1990 | Bodkin |
| 5,148,344 A | 9/1992 | Ashley et al. |
| 5,185,687 A | 2/1993 | Beihoff et al. |
| 5,202,662 A | 4/1993 | Bienwald et al. |
| 5,223,810 A | 6/1993 | Van Haaren |
| 5,224,006 A | 6/1993 | MacKenzie et al. |
| 5,229,730 A | 7/1993 | Legatti et al. |
| 5,347,248 A | 9/1994 | Herbert |
| 5,363,269 A | 11/1994 | McDonals |
| 5,418,678 A | 5/1995 | McDonald |
| 5,448,443 A | 9/1995 | Muelleman |
| 5,477,412 A | 12/1995 | Neiger et al. |
| 5,510,760 A | 4/1996 | Marcou et al. |
| 5,517,165 A | 5/1996 | Cook |
| 5,541,800 A | 7/1996 | Misencik |
| 5,555,150 A | 9/1996 | Newman |
| 5,594,398 A | 1/1997 | Marcou et al. |
| 5,600,524 A | 2/1997 | Neiger et al. |
| 5,617,284 A | 4/1997 | Paradise |
| 5,625,285 A | 4/1997 | Virgilo et al. |
| 5,628,394 A * | 5/1997 | Benke et al. ............... 200/400 |
| 5,631,798 A | 5/1997 | Seymour et al. |
| 5,637,000 A | 6/1997 | Osterbrock et al. |
| 5,655,648 A | 8/1997 | Rosen et al. |
| 5,661,623 A | 8/1997 | McDonald et al. |
| 5,694,280 A | 12/1997 | Zhou |
| 5,706,155 A | 1/1998 | Neiger et al. |
| 5,719,363 A * | 2/1998 | Handler ................... 200/50.02 |
| 5,729,417 A | 3/1998 | Neiger et al. |
| 5,805,397 A | 9/1998 | MacKenzie |
| 5,815,363 A | 9/1998 | Chu |
| 5,825,602 A | 10/1998 | Tosaka et al. |
| 5,844,765 A | 12/1998 | Kato et al. |
| 5,847,913 A | 12/1998 | Turner et al. |
| 5,875,087 A | 2/1999 | Spencer et al. |
| 5,933,063 A | 8/1999 | Keung et al. |
| 5,943,198 A | 8/1999 | Hirsh et al. |
| 5,956,218 A | 9/1999 | Berthold |
| 5,963,408 A | 10/1999 | Neiger et al. |
| 6,040,967 A | 3/2000 | DiSalvo |
| 6,052,265 A | 4/2000 | Zaretsky et al. |
| 6,226,161 B1 | 5/2001 | Gershen et al. |
| 6,246,558 B1 | 6/2001 | DiSalvo et al. |
| 6,252,407 B1 | 6/2001 | Gershen |
| 6,282,070 B1 | 8/2001 | Ziegler et al. |
| 6,288,882 B1 | 9/2001 | DiSalvo et al. |
| 6,309,248 B1 | 10/2001 | King |
| 6,324,043 B1 | 11/2001 | Turner |
| 6,381,112 B1 | 4/2002 | DiSalvo et al. |
| 6,437,700 B1 | 8/2002 | Herzfeld et al. |
| 6,437,953 B1 | 8/2002 | DiSalvo et al. |
| D462,660 S | 9/2002 | Huang et al. |
| 6,580,344 B1 * | 6/2003 | Li ................. 335/18 |
| 6,590,172 B1 * | 7/2003 | Gadre et al. ........... 335/16 |
| 6,590,753 B1 | 7/2003 | Finlay |
| 6,621,388 B1 | 9/2003 | Macbeth |
| 6,628,486 B1 * | 9/2003 | Macbeth ............... 361/42 |
| 6,646,838 B1 | 11/2003 | Ziegler et al. |
| 6,657,834 B1 | 12/2003 | DiSalvo |
| 6,671,145 B1 | 12/2003 | Germain et al. |
| 6,693,779 B1 | 2/2004 | DiSalvo |
| 6,717,782 B1 | 4/2004 | DiSalvo et al. |
| 6,771,152 B1 | 8/2004 | Germain et al. |
| 6,864,766 B1 | 3/2005 | DiSalvo et al. |
| 6,864,769 B1 | 3/2005 | Germain et al. |
| 2003/0085783 A1 * | 5/2003 | Macbeth ............... 335/18 |
| 2003/0151478 A1 | 8/2003 | Radosavljevic et al. |

FOREIGN PATENT DOCUMENTS

| | | |
|---|---|---|
| AU | 775072 | 10/2004 |
| EP | 0 526 071 A | 2/1993 |
| GB | 830018 | 3/1960 |
| GB | 2207823 | 2/1989 |
| GB | 2290181 A | 12/1995 |
| WO | WO 96/01484 A | 1/1996 |
| WO | PCT/US99/19319 | 3/2000 |
| WO | PCT/US00/22955 | 3/2001 |
| WO | PCT/US01/32562 | 4/2002 |
| WO | WO2004/070751 A3 | 8/2004 |
| WO | WO2004/0707052 A2 | 8/2004 |

* cited by examiner

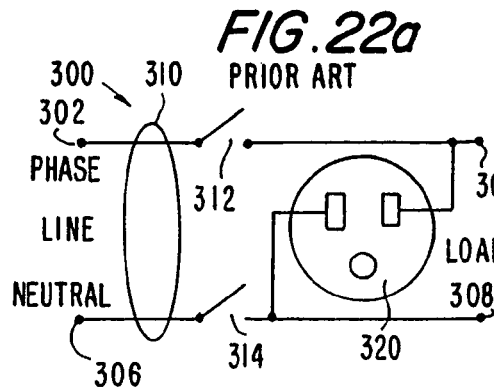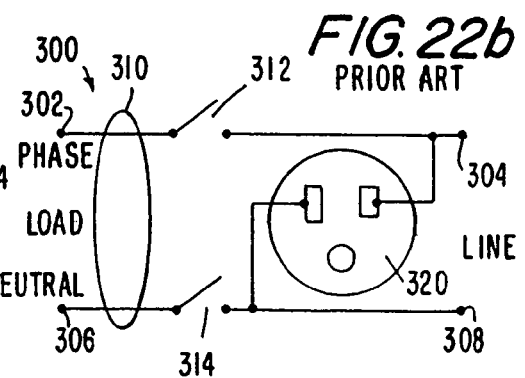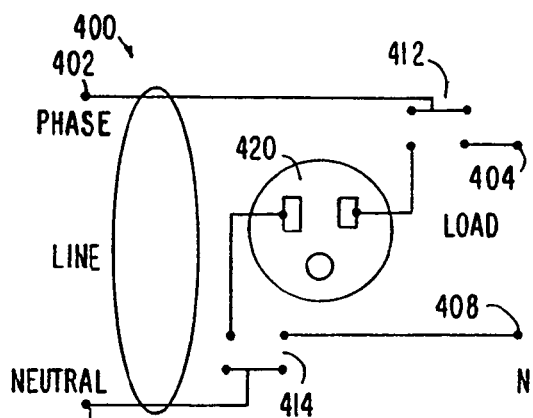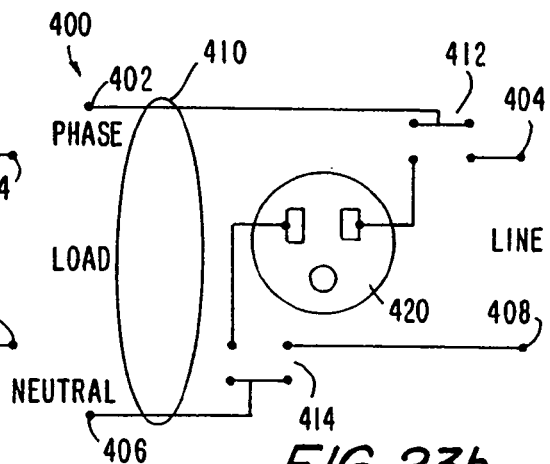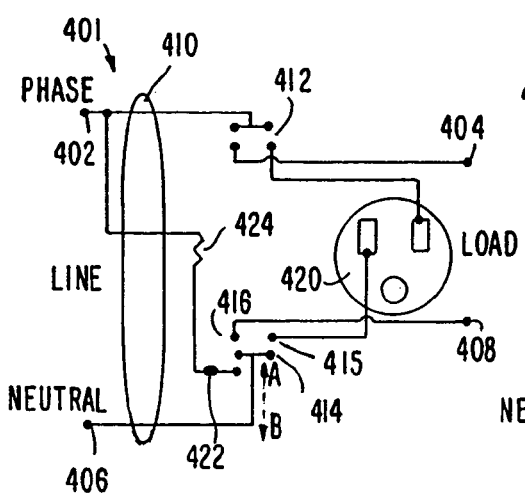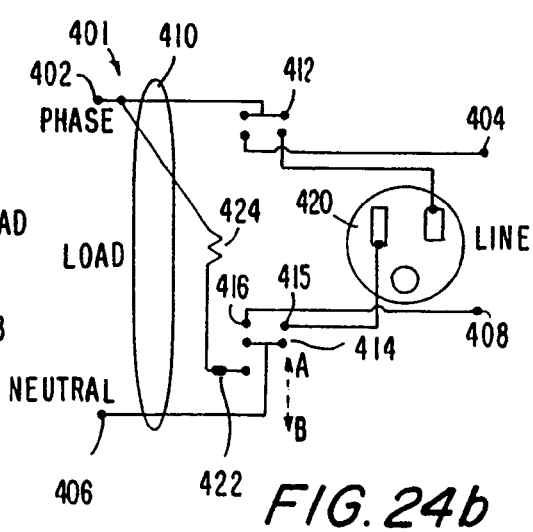

CIRCUIT INTERRUPTING DEVICE WITH RESET LOCKOUT AND REVERSE WIRING PROTECTION AND METHOD OF MANUFACTURE

CROSS-REFERENCE TO RELATED APPLICATIONS

This application is a continuation-in-part of application Ser. No. 09/379,138 filed Aug. 20, 1999, now U.S. Pat. No. 6,246,558 which is a continuation-in-part of application Ser. No. 09/367,759 filed Aug. 6, 1999, now U.S. Pat. No. 6,282,070 which is a continuation-in-part of application Ser. No. 09/138,955, filed Aug. 24, 1998, now U.S. Pat. No. 6,040,967, all of which are incorporated herein in their entirety by reference.

This application is related to application Ser. No. 09/379,140 filed Aug. 20, 1999, which is a continuation-in-part of application Ser. No. 09/369,759 filed Aug. 6, 1999, which is a continuation-in-part of application Ser. No. 09/138,955, filed Aug. 24, 1998, now U.S. Pat. No. 6,040,967, all of which are incorporated herein in their entirety by reference.

This application is related to application Ser. No. 09/204,861, filed Dec. 3, 1998, which is a division of application Ser. No. 08/768,689 filed Dec. 18, 1996, each of which is incorporated herein in its entirety by reference.

This application is related to commonly owned application Ser. No. To Be Determined, filed Mar. 20, 2001, entitled Reset Lockout for Sliding Latch GFCI, by inventors Frantz German, Stephen Stewart, David Herzfeld, Steven Campolo, Nicholas Disalvo and William R. Ziegler, having Ser. No. 09/812,875 which is a continuation-in-part of application Ser. No. 09/688,481 filed Oct. 16, 2000, now U.S. Pat. No. 6,437,700, all of which are incorporated herein in their entirety by reference.

BACKGROUND

1. Field

The present application is directed to resettable circuit interrupting devices including without limitation ground fault circuit interrupters (GFCI's), arc fault circuit interrupters (AFCI's), immersion detection circuit interrupters (IDCI's), appliance leakage circuit interrupters (ALCI's), equipment leakage circuit interrupters (ELCI's), circuit breakers, contactors, latching relays and solenoid mechanisms. More particularly, the present application is directed to circuit interrupting devices that include a circuit interrupting portion that can break electrically conductive paths between a line side and a load side of the device and between a line side and a user load. Certain embodiments of the present application are directed to circuit interrupting devices including a reset lock out portion capable of preventing the device from resetting if the circuit interrupting portion is not functioning, if an open neutral condition exists or if the device is mis-wired. Certain embodiments of the present application are directed to methods of manufacturing circuit interrupting devices to be initially in a tripped condition. Certain embodiments of the present application are directed to methods of manufacturing circuit interrupting devices to be initially in a reset lock out condition.

2. Description of the Related Art

Many electrical wiring devices have a line side, which is connectable to an electrical power supply, and a load side, which is connectable to one or more loads and at least one conductive path between the line and load sides. Electrical connections to wires supplying electrical power or wires conducting electricity to the one or more loads are at line side and load side connections. The electrical wiring device industry has witnessed an increasing call for circuit breaking devices or systems which are designed to interrupt power to various loads, such as household appliances, consumer electrical products and branch circuits. In particular, electrical codes require electrical circuits in home bathrooms and kitchens to be equipped with ground fault circuit interrupters (GFCI), for example. Presently available GFCI devices, such as the device described in commonly owned U.S. Pat. No. 4,595,894, use an electrically activated trip mechanism to mechanically break an electrical connection between the line side and the load side. Such devices are resettable after they are tripped by, for example, the detection of a ground fault. In the device discussed in the '894 patent, the trip mechanism used to cause the mechanical breaking of the circuit (i.e., the conductive path between the line and load sides) includes a solenoid (or trip coil). A test button is used to test the trip mechanism and circuitry used to sense faults, and a reset button is used to reset the electrical connection between line and load sides.

However, instances may arise where an abnormal condition, caused by for example a lightning strike, occurs which may result not only in a surge of electricity at the device and a tripping of the device but also a disabling of the trip mechanism used to cause the mechanical breaking of the circuit. This may occur without the knowledge of the user. Under such circumstances an unknowing user, faced with a GFCI which has tripped, may press the reset button which, in turn, will cause the device with an inoperative trip mechanism to be reset without the ground fault protection available.

Further, an open neutral condition, which is defined in Underwriters Laboratories (UL) Standard PAG 943A, may exist with the electrical wires supplying electrical power to such GFCI devices. If an open neutral condition exists with the neutral wire on the line (versus load) side of the GFCI device, an instance may arise where a current path is created from the phase (or hot) wire supplying power to the GFCI device through the load side of the device and a person to ground. In the event that an open neutral condition exists, current GFCI devices, which have tripped, may be reset even though the open neutral condition may remain.

Commonly owned application Ser. No. 09/138,955, filed Aug. 24, 1998, now U.S. Pat. No. 6,040,967, which is incorporated herein in its entirety by reference, describes a family of resettable circuit interrupting devices capable of locking out the reset portion of the device if the circuit interrupting portion is non-operational or if an open neutral condition exists.

Some of the circuit interrupting devices described above have a user accessible load side connection in addition to the line and load side connections. The user accessible load side connection includes one or more connection points where a user can externally connect to electrical power supplied from the line side. The load side connection and user accessible load side connection are typically electrically connected together. An example of such a circuit interrupting device is a GFCI receptacle, where the line and load side connections are binding screws and the user accessible load side connection is the plug connection to an internal receptacle. As noted, such devices are connected to external wiring so that line wires are connected to the line side connection and load side wires are connected to the load side connection. However, instances may occur where the circuit interrupting device is improperly connected to the external wires so that the load wires are connected to the line side connection and the line wires are connected to the load connection. This is known as reverse wiring. In the event the circuit interrupting device is reverse wired, fault protection to the user accessible load connection may be eliminated, even if fault protection to the load side connection remains.

Furthermore, studies related to GFCI devices indicate that perhaps 10–20% or more of all GFCI devices installed were found to be inoperable by the user. However, after those devices were returned to the manufacturer, most were found to be operational. Accordingly, it has been suggested that the devices were reverse wired by the user (line-load side reversal). Furthermore, regulatory codes and industry standards codes such as those by Underwriters Laboratories (UL) may require that GFCI devices be manufactured with a warning label advising the user to correctly wire the line and load terminals of the device. However, even such warnings may not be adequate as suggested by the studies above. Furthermore, a reasonably foolproof mis-wiring prevention scheme may obviate the need for such a warning label.

Conventional GFCI devices may utilize a user load such as a face receptacle. Typically GFCIs are four terminal devices, two phase or AC leads for connection to AC electrical power and two LOAD leads for connection to downstream devices. If a conventional GFCI is properly wired, the GFCI provides ground fault protection for devices downstream and the incorporated receptacle. However, if a conventional GFCI is reverse wired, unprotected power is provided to the receptacle face at all times. For example, when a conventional GFCI is reverse wired, the face receptacle is "upstream" from the current imbalance sensor coil. Accordingly, if the conventional GFCI is in either the tripped or normal state, the face receptacle is provide unprotected power.

In spite of detailed instructions that come packaged with most GFCIs and identification of AC and LOAD terminals, GFCIs are sometimes mis-wired. One reason that this problem exists is that in new construction, both the input line and downstream cables appear identical when the installer is connecting a new ground fault circuit interrupter. This is especially a problem in new construction where there is no power available in order to test which cable is leading current into the device.

The problem may be compounded when it is considered that many typical duplex receptacle GFCIs have a test button that will trip and shut off the power when pushed to verify operations of internal functions in the GFCI. However, use of the test button does not indicate whether the built in duplex receptacle is protected. Typical users may not be aware of this. Users simply test the device after installation and verify that the unit trips upon pressing the test button by way of an audible click, for example. This gives the user a false sense that all is well. What is actually happening when the GFCI is reverse wired is that the GFCI disconnects power from and protects everything downstream, but does not protect the receptacle contacts of the GFCI itself. The device will trip depending on the condition of internal components and irrespective of how the GFCI was wired. It does not matter that the GFCI was reverse wired when it was tested.

Certain references described devices that attempt to warn the user of a reverse wiring condition. For example, one approach utilizes a GFCI with reverse line polarity lamp indicator to indicate proper installation of the GFCI. See, for example, U.S. Pat. No. 4,412,193 issued to Bienwald et al. on Oct. 25, 1983 and assigned to the owner of the present invention. However, a push button needs to be manually pressed in accordance with instructions in order to detect whether the GFCI is mis-wired.

In another example, U.S. Pat. No. 5,477,412 issued to Neiger et al. on Dec. 19, 1995 and owned by the assignee of the present invention, is directed to a ground fault circuit interrupter incorporating mis-wiring prevention circuitry. Mis-wiring sense circuitry automatically triggers the generation of visual and audible alarms in the event of mis-wiring conditions. The circuit employs an alarm inhibiting technique that incorporates sense circuitry connected to the AC terminals on one side of the internal GFCI switches or relays and alarm generation circuitry connected to the load terminal on the opposite side.

Commonly owned application Serial No. application Ser. No. 09/204,861, filed Dec. 3, 1998, which is incorporated herein in its entirety by reference, describes a device to test for reverse wiring and provide an indication of reverse wiring.

SUMMARY

The present application relates to a resettable circuit interrupting devices that maintain fault protection for the circuit interrupting device even if the device is reverse wired.

In one embodiment, the circuit interrupting device includes a housing and phase and neutral conductive paths disposed at least partially within the housing between line and load sides. Preferably, the phase conductive path terminates at a first connection capable of being electrically connected to a source of electricity, a second connection capable of conducting electricity to at least one load and a third connection capable of conducting electricity to at least one user accessible load. Similarly, the neutral conductive path, preferably, terminates at a first connection capable of being electrically connected to a source of electricity, a second connection capable of providing a neutral connection to the at least one load and a third connection capable of providing a neutral connection to the at least one user accessible load;

The circuit interrupting device also includes a circuit interrupting portion that is disposed within the housing and configured to cause electrical discontinuity in one or both of the phase and neutral conductive paths, between said line side and said load side upon the occurrence of a predetermined condition. A reset portion is disposed at least partially within the housing and is configured to reestablish electrical continuity in the open conductive paths.

Preferably, the phase conductive path includes a plurality of contacts that are capable of opening to cause electrical discontinuity in the phase conductive path and closing to reestablish electrical continuity in the phase conductive path, between said line and load sides. The neutral conductive path also includes a plurality of contacts that are capable of opening to cause electrical discontinuity in the neutral conductive path and closing to reestablish electrical continuity in the neutral conductive path, between said line and load sides. In this configuration, the circuit interrupting portion causes the plurality of contacts of the phase and neutral conductive paths to open, and the reset portion causes the plurality of contacts of the phase and neutral conductive paths to close.

One embodiment for the circuit interrupting portion uses an electro-mechanical circuit interrupter to cause electrical discontinuity in the phase and neutral conductive paths, and sensing circuitry to sense the occurrence of the predetermined condition. For example, the electromechanical circuit interrupter include a coil assembly, a movable plunger attached to the coil assembly and a banger attached to the plunger. The movable plunger is responsive to energizing of the coil assembly, and movement of the plunger is translated to movement of said banger. Movement of the banger causes the electrical discontinuity in the phase and/or neutral conductive paths.

The circuit interrupting device may also include reset lockout portion that prevents the reestablishing of electrical continuity in either the phase or neutral conductive path or both conductive paths, unless the circuit interrupting portion is operating properly. That is, the reset lockout prevents resetting of the device unless the circuit interrupting portion is operating properly. In embodiments where the circuit interrupting device includes a reset lockout portion, the reset portion may be configured so that at least one reset contact is electrically connected to the sensing circuitry of the circuit interrupting portion, and that depression of a reset button causes at least a portion of the phase conductive path to contact at least one reset contact. When contact is made between the phase conductive path and the at least one reset contact, the circuit interrupting portion is activated so that the reset lockout portion is disabled and electrical continuity in the phase and neutral conductive paths can be reestablished.

The circuit interrupting device may also include a trip portion that operates independently of the circuit interrupting portion. The trip portion is disposed at least partially within the housing and is configured to cause electrical discontinuity in the phase and/or neutral conductive paths independent of the operation of the circuit interrupting portion. In one embodiment, the trip portion includes a trip actuator accessible from an exterior of the housing and a trip arm preferably within the housing and extending from the trip actuator. The trip arm is preferably configured to facilitate mechanical breaking of electrical continuity in the phase and/or neutral conductive paths, if the trip actuator is actuated. Preferably, the trip actuator is a button. However, other known actuators are also contemplated.

In an embodiment, the circuit interrupter is manufactured having a bridge circuit separately disconnecting a load side and a user load when the circuit interrupter trips. In another embodiment, two single-pole, single throw switching devices are used to switch each power line from the load and the user load respectively. In another embodiment, the circuit interrupter is manufactured in a reset lock out state. In another embodiment, a removable or fixedly connected trip force device is utilized to force a trip upon installation. In another embodiment, an indicator provides an indication of reverse wiring. In another embodiment, a separate trip force device is connected to the circuit interrupter before it is delivered into the stream of commerce. In a method embodiment, the circuit interrupter is set to a reset lock out state before being delivered into the stream of commerce.

BRIEF DESCRIPTION OF THE DRAWINGS

Preferred embodiments of the present application are described herein with reference to the drawings in which similar elements are given similar reference characters, wherein:

FIGS. 22*a–b* are partial schematic diagrams of a conventional GFCI properly wired in FIG. 22*a* and reverse wired in FIG. 22*b*;

FIGS. 23*a–b* are partial schematic diagrams of a GFCI according to an embodiment of the present invention properly wired in FIG. 23*a* and reverse wired in FIG. 23*b*;

FIGS. 24*a–b* are partial schematic diagrams of a GFCI according to an another embodiment of the present invention having a reset lock out shown properly wired in FIG. 24*a* and reverse wired in FIG. 24*b*;

DETAILED DESCRIPTION OF EMBODIMENTS

Figure 1:
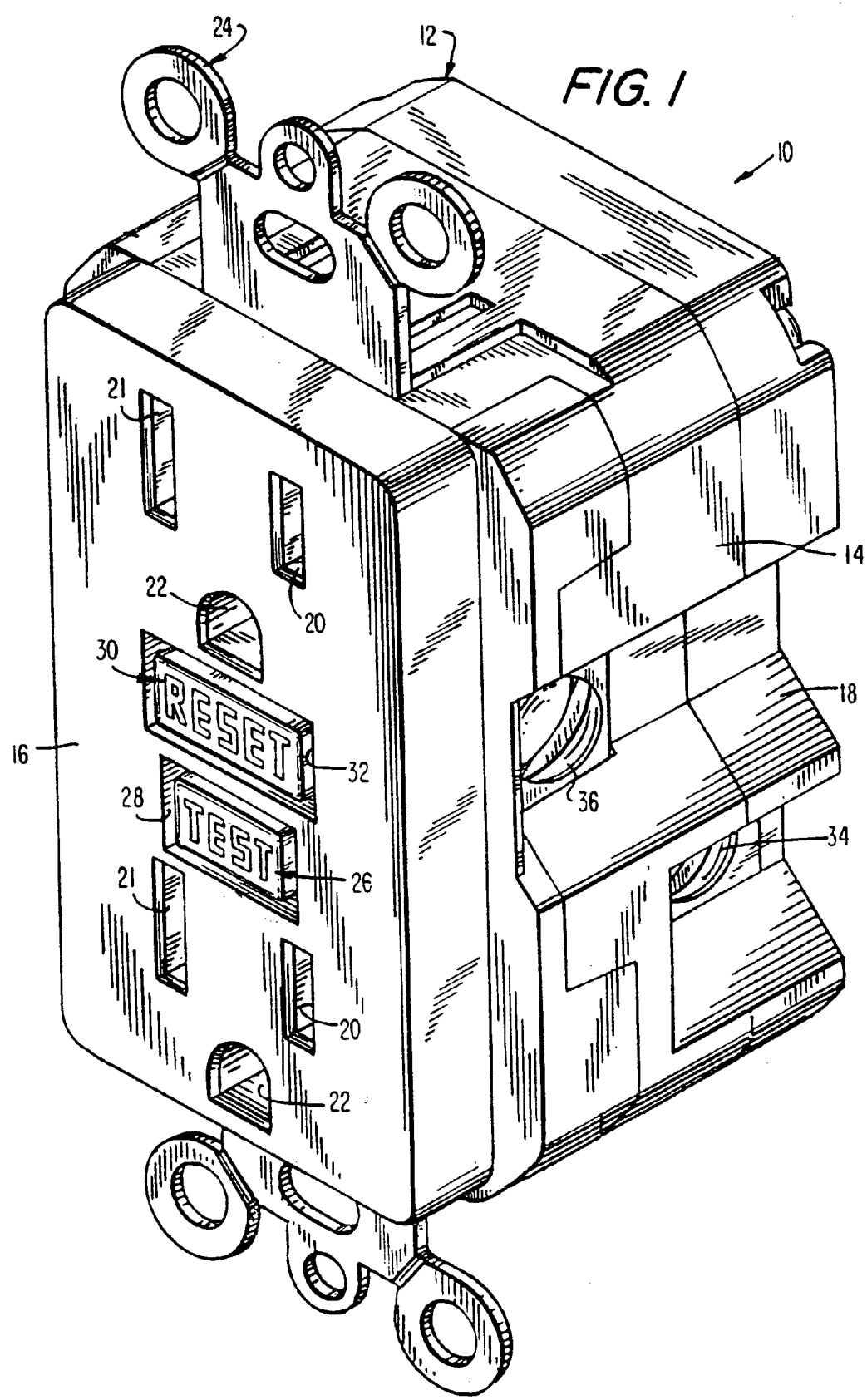
FIG. 1 is a perspective view of one embodiment of a ground fault circuit interrupting device according to the present application.

The present application contemplates various types of circuit interrupting devices that are capable of breaking at least one conductive path at both a line side and a load side of the device. The conductive path is typically divided between a line side that connects to supplied electrical power and a load side that connects to one or more loads. As noted, the various devices in the family of resettable circuit interrupting devices include: ground fault circuit interrupters (GFCI's), arc fault circuit interrupters (AFCI's), immersion detection circuit interrupters (IDCI's), appliance leakage circuit interrupters (ALCI's) and equipment leakage circuit interrupters (ELCI's).

For the purpose of the present application, the structure or mechanisms used in the circuit interrupting devices, shown in the drawings and described hereinbelow, are incorporated into a GFCI receptacle suitable for installation in a single-gang junction box used in, for example, a residential electrical wiring system. However, the mechanisms according to the present application can be included in any of the various devices in the family of resettable circuit interrupting devices.

The GFCI receptacles described herein have line and load phase (or power) connections, line and load neutral connections and user accessible load phase and neutral connections. The connections permit external conductors or appliances to be connected to the device. These connections may be, for example, electrical fastening devices that secure or connect external conductors to the circuit interrupting device, as well as conduct electricity. Examples of such connections include binding screws, lugs, terminals and external plug connections.

In one embodiment, the GFCI receptacle has a circuit interrupting portion, a reset portion and a reset lockout. This embodiment is shown in FIGS. 1–11. In another embodiment, the GFCI receptacle is similar to the embodiment of FIGS. 1–11, except the reset lockout is omitted. Thus, in this embodiment, the GFCI receptacle has a circuit interrupting portion and a reset portion, which is similar to those described in FIGS. 1–12. In another embodiment, the GFCI receptacle has a circuit interrupting portion, a reset portion, a reset lockout and an independent trip portion. This embodiment is shown in FIGS. 13–20.

The circuit interrupting and reset portions described herein preferably use electromechanical components to break (open) and make (close) one or more conductive paths between the line and load sides of the device. However, electrical components, such as solid state switches and supporting circuitry, may be used to open and close the conductive paths.

Generally, the circuit interrupting portion is used to automatically break electrical continuity in one or more conductive paths (i.e., open the conductive path) between the line and load sides upon the detection of a fault, which in the embodiments described is a ground fault. The reset portion is used to close the open conductive paths.

In the embodiments including a reset lockout, the reset portion is used to disable the reset lockout, in addition to closing the open conductive paths. In this configuration, the operation of the reset and reset lockout portions is in conjunction with the operation of the circuit interrupting portion, so that electrical continuity in open conductive paths cannot be reset if the circuit interrupting portion is non-operational, if an open neutral condition exists and/or if the device is reverse wired.

In the embodiments including an independent trip portion, electrical continuity in one or more conductive paths can be broken independently of the operation of the circuit interrupting portion. Thus, in the event the circuit interrupting portion is not operating properly, the device can still be tripped.

The above-described features can be incorporated in any resettable circuit interrupting device, but for simplicity the descriptions herein are directed to GFCI receptacles.

Turning now to FIG. 1, the GFCI receptacle 10 has a housing 12 consisting of a relatively central body 14 to which a face or cover portion 16 and a rear portion 18 are removably secured. The face portion 16 has entry ports 20 and 21 for receiving normal or polarized prongs of a male plug of the type normally found at the end of a lamp or appliance cord set (not shown), as well as ground-prong-receiving openings 22 to accommodate a three-wire plug. The receptacle also includes a mounting strap 24 used to fasten the receptacle to a junction box.

A test button 26 extends through opening 28 in the face portion 16 of the housing 12. The test button is used to activate a test operation, that tests the operation of the circuit interrupting portion (or circuit interrupter) disposed in the device. The circuit interrupting portion, to be described in more detail below, is used to break electrical continuity in one or more conductive paths between the line and load side of the device. A reset button 30 forming a part of the reset portion extends through opening 32 in the face portion 16 of the housing 12. The reset button is used to activate a reset operation, which reestablishes electrical continuity in the open conductive paths.

Electrical connections to existing household electrical wiring are made via binding screws 34 and 36, where screw 34 is an input (or line) phase connection, and screw 36 is an output (or load) phase connection. It should be noted that two additional binding screws 38 and 40 (seen in FIG. 3) are located on the opposite side of the receptacle 10. These additional binding screws provide line and load neutral connections, respectively. A more detailed description of a GFCI receptacle is provided in U.S. Pat. No. 4,595,894, which is incorporated herein in its entirety by reference. It should also be noted that binding screws 34, 36, 38 and 40 are exemplary of the types of wiring terminals that can be used to provide the electrical connections. Examples of other types of wiring terminals include set screws, pressure clamps, pressure plates, push-in type connections, pigtails and quick-connect tabs.

Referring to FIGS. 2–6, the conductive path between the line phase connection 34 and the load phase connection 36 includes contact arm 50 which is movable between stressed and unstressed positions, movable contact 52 mounted to the contact arm 50, contact arm 54 secured to or monolithically formed into the load phase connection 36 and fixed contact 56 mounted to the contact arm 54. The user accessible load phase connection for this embodiment includes terminal assembly 58 having two binding terminals 60 which are capable of engaging a prong of a male plug inserted therebetween. The conductive path between the line phase connection 34 and the user accessible load phase connection includes, contact arm 50, movable contact 62 mounted to contact arm 50, contact arm 64 secured to or monolithically formed into terminal assembly 58, and fixed contact 66 mounted to contact arm 64. These conductive paths are collectively called the phase conductive path.

Similarly, the conductive path between the line neutral connection 38 and the load neutral connection 40 includes, contact arm 70 which is movable between stressed and unstressed positions, movable contact 72 mounted to contact arm 70, contact arm 74 secured to or monolithically formed into load neutral connection 40, and fixed contact 76 mounted to the contact arm 74. The user accessible load neutral connection for this embodiment includes terminal assembly 78 having two binding terminals 80 which are capable of engaging a prong of a male plug inserted therebetween. The conductive path between the line neutral connection 38 and the user accessible load neutral connection includes, contact arm 70, movable contact 82 mounted to the contact arm 70, contact arm 84 secured to or monolithically formed into terminal assembly 78, and fixed contact 86 mounted to contact arm 84. These conductive paths are collectively called the neutral conductive path.

Figure 2:
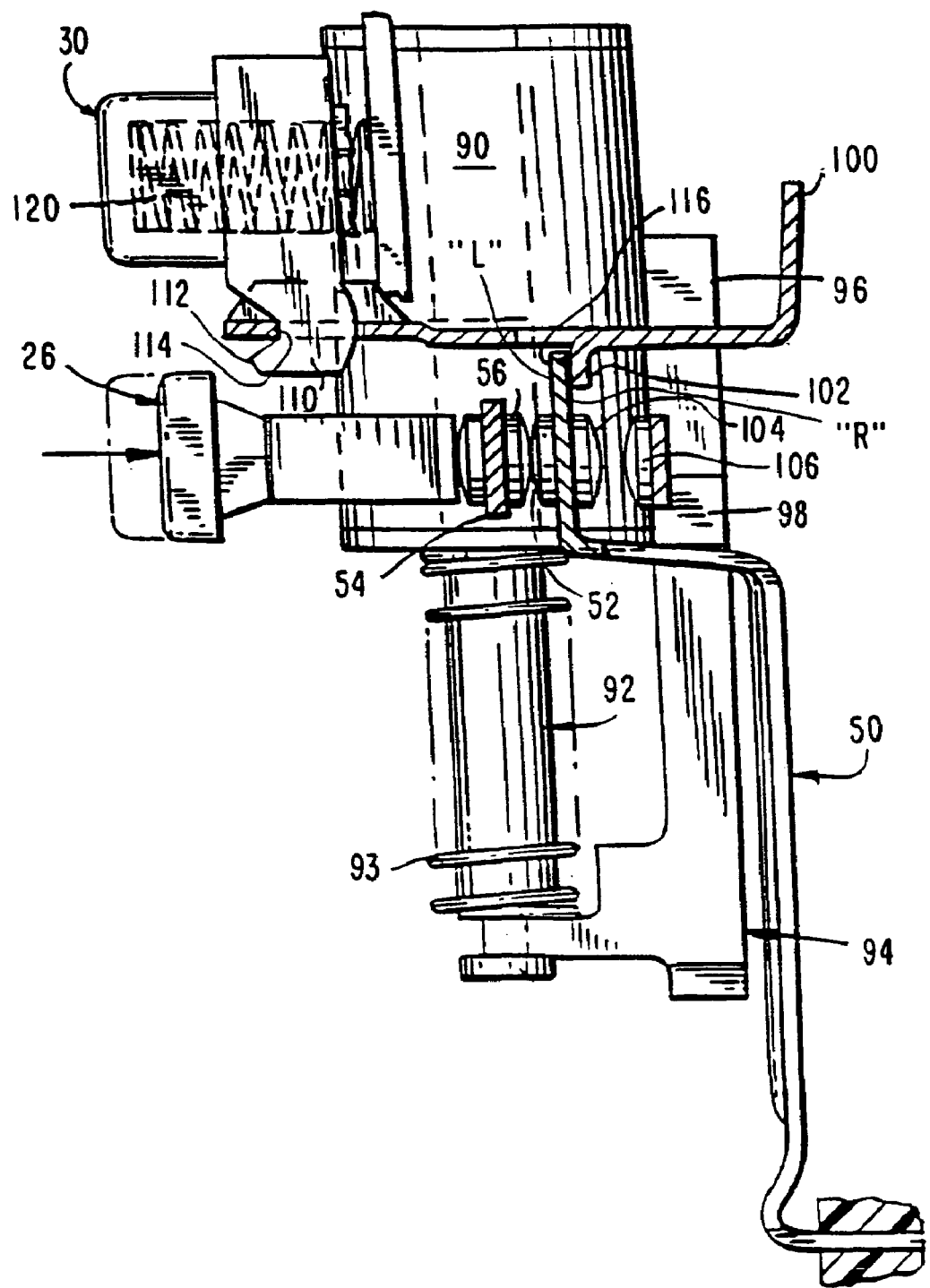
FIG. 2 is side elevational view, partly in section, of a portion of the GFCI device shown in FIG. 1, illustrating the GFCI device in a set or circuit making position.
Figure 12:
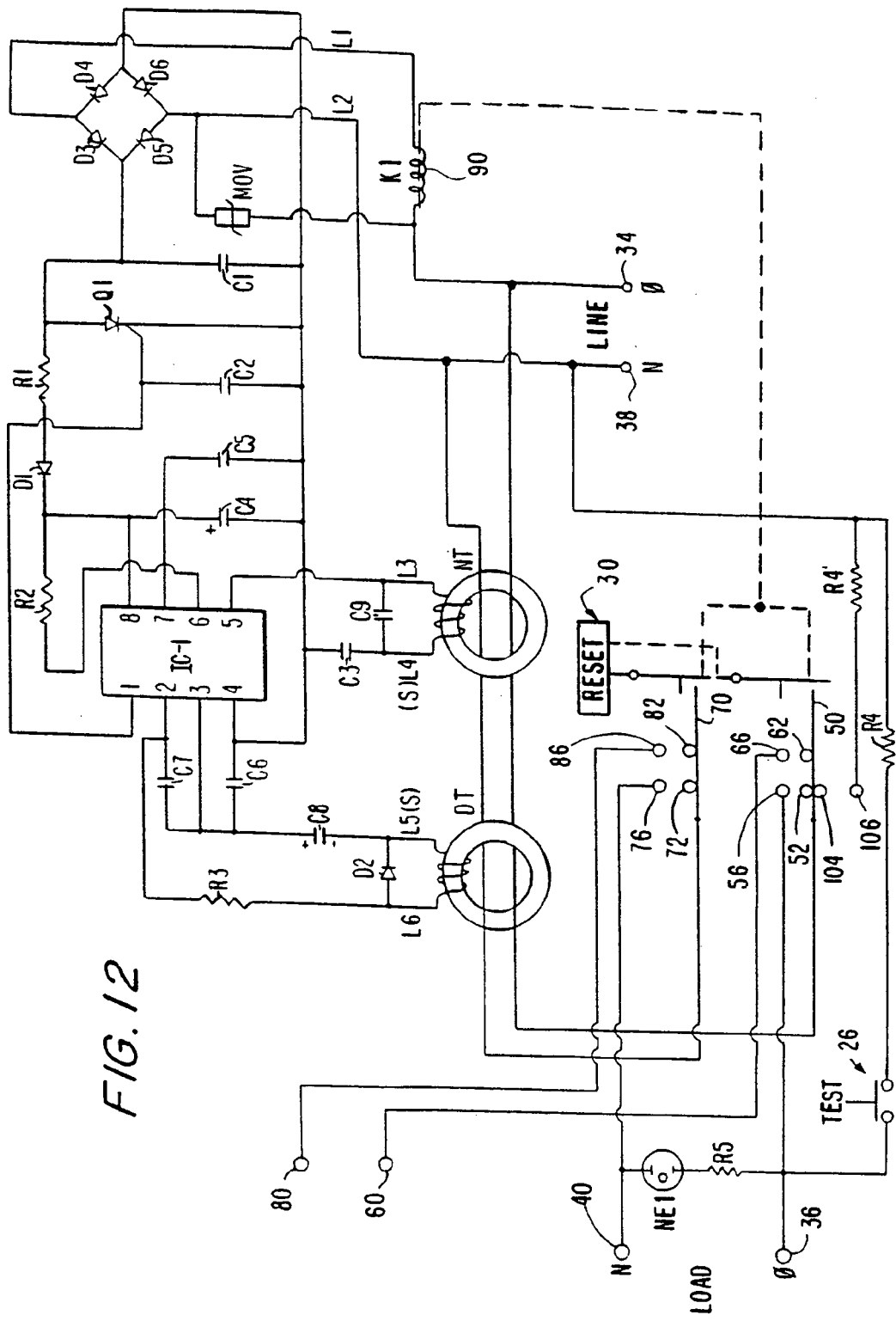
FIG. 12 is a schematic diagram of a circuit for detecting ground faults and resetting the GFCI device of FIG. 1.

Referring to FIG. 2, the circuit interrupting portion has a circuit interrupter and electronic circuitry capable of sensing faults, e.g., current imbalances, on the hot and/or neutral conductors. In a preferred embodiment for the GFCI receptacle, the circuit interrupter includes a coil assembly 90, a plunger 92 responsive to the energizing and de-energizing of the coil assembly and a banger 94 connected to the plunger 92. The banger 94 has a pair of banger dogs 96 and 98 which interact with a movable latching members 100 used to set and reset electrical continuity in one or more conductive paths. The coil assembly 90 is activated in response to the sensing of a ground fault by, for example, the sense circuitry shown in FIG. 12. FIG. 12 shows conventional circuitry for detecting ground faults that includes a differential transformer that senses current imbalances.

The reset portion includes reset button 30, the movable latching members 100 connected to the reset button 30, latching fingers 102 and reset contacts 104 and 106 that temporarily activate the circuit interrupting portion when the reset button is depressed, when in the tripped position. Preferably, the reset contacts 104 and 106 are normally open momentary contacts. The latching fingers 102 are used to engage side R of each contact arm 50,70 and move the arms 50,70 back to the stressed position where contacts 52,62 touch contacts 56,66, respectively, and where contacts 72,82 touch contacts 76,86, respectively.

The movable latching members 102 are, in this embodiment, common to each portion (i.e., the circuit interrupting, reset and reset lockout portions) and used to facilitate making, breaking or locking out of electrical continuity of one or more of the conductive paths. However, the circuit interrupting devices according to the present application also contemplate embodiments where there is no common mechanism or member between each portion or between certain portions. Further, the present application also contemplates using circuit interrupting devices that have circuit interrupting, reset and reset lockout portions to facilitate making, breaking or locking out of the electrical continuity of one or both of the phase or neutral conductive paths.

Figure 3:
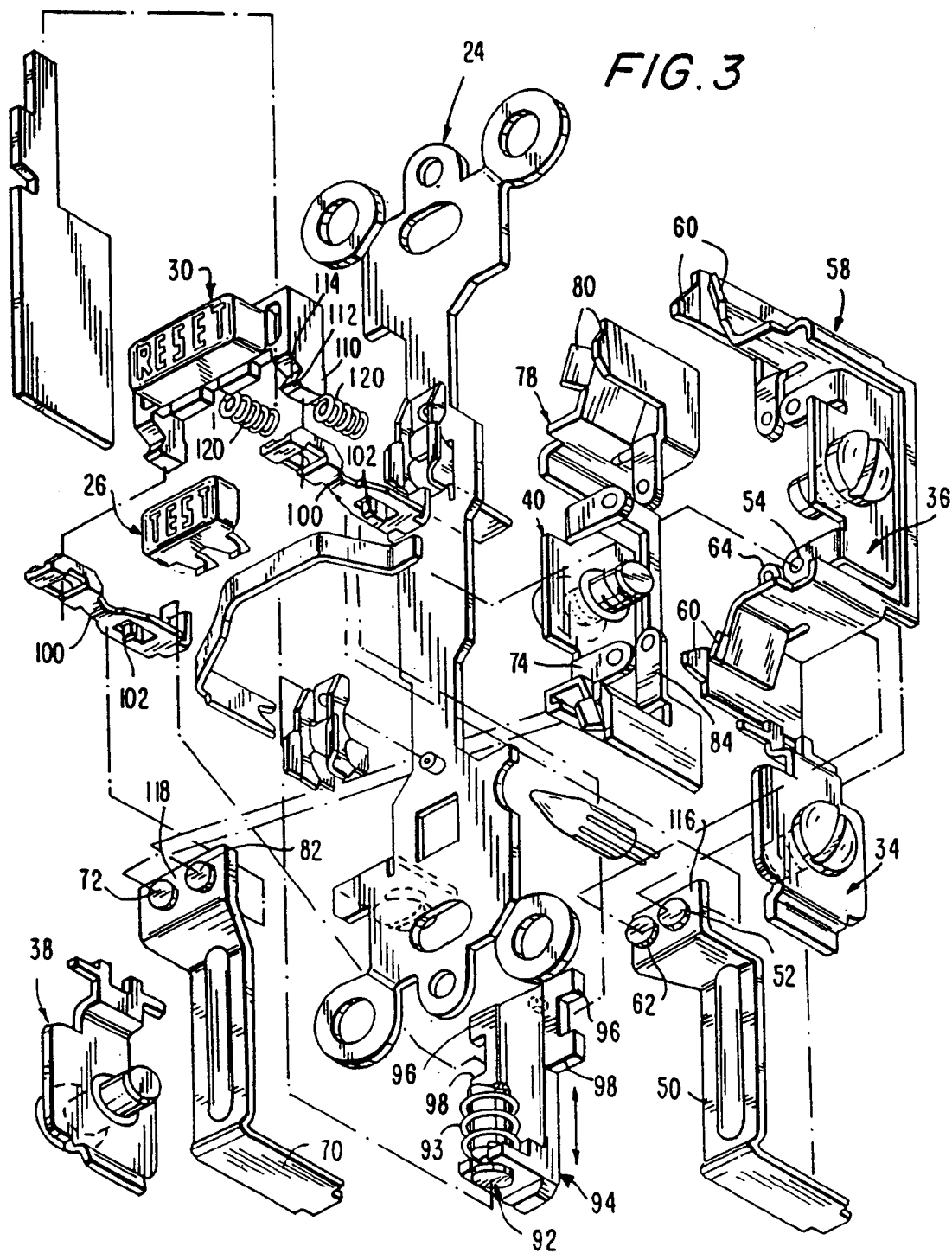
FIG. 3 is an exploded view of internal components of the circuit interrupting device of FIG. 1.

In the embodiment shown in FIGS. 2 and 3, the reset lockout portion includes latching fingers 102 which after the device is tripped, engages side L of the movable arms 50,70 so as to block the movable arms 50,70 from moving. By blocking movement of the movable arms 50,70, contacts 52 and 56, contacts 62 and 66, contacts 72 and 76 and contacts 82 and 86 are prevented from touching. Alternatively, only one of the movable arms 50 or 70 may be blocked so that their respective contacts are prevented from touching. Further, in this embodiment, latching fingers 102 act as an active inhibitor that prevents the contacts from touching. Alternatively, the natural bias of movable arms 50 and 70 can be used as a passive inhibitor that prevents the contacts from touching.

Referring now to FIGS. 2 and 7–11, the mechanical components of the circuit interrupting and reset portions in various stages of operation are shown. For this part of the description, the operation will be described only for the phase conductive path, but the operation is similar for the neutral conductive path, if it is desired to open and close both conductive paths. In FIG. 2, the GFCI receptacle is shown in a set position where movable contact arm 50 is in a stressed condition so that movable contact 52 is in electrical engagement with fixed contact 56 of contact arm 54. If the sensing circuitry of the GFCI receptacle senses a ground fault, the coil assembly 90 is energized to draw plunger 92 into the coil assembly 90 so that banger 94 moves upwardly. As the banger moves upwardly, the banger front dog 98 strikes the latch member 100 causing it to pivot in a counterclockwise direction C (seen in FIG. 7) about the joint created by the top edge 112 and inner surface 114 of finger 110. The movement of the latch member 100 removes the latching finger 102 from engagement with side R of the remote end 116 of the movable contact arm 50, and permits the contact arm 50 to return to its pre-stressed condition opening contacts 52 and 56, seen in FIG. 7.

Figure 10:
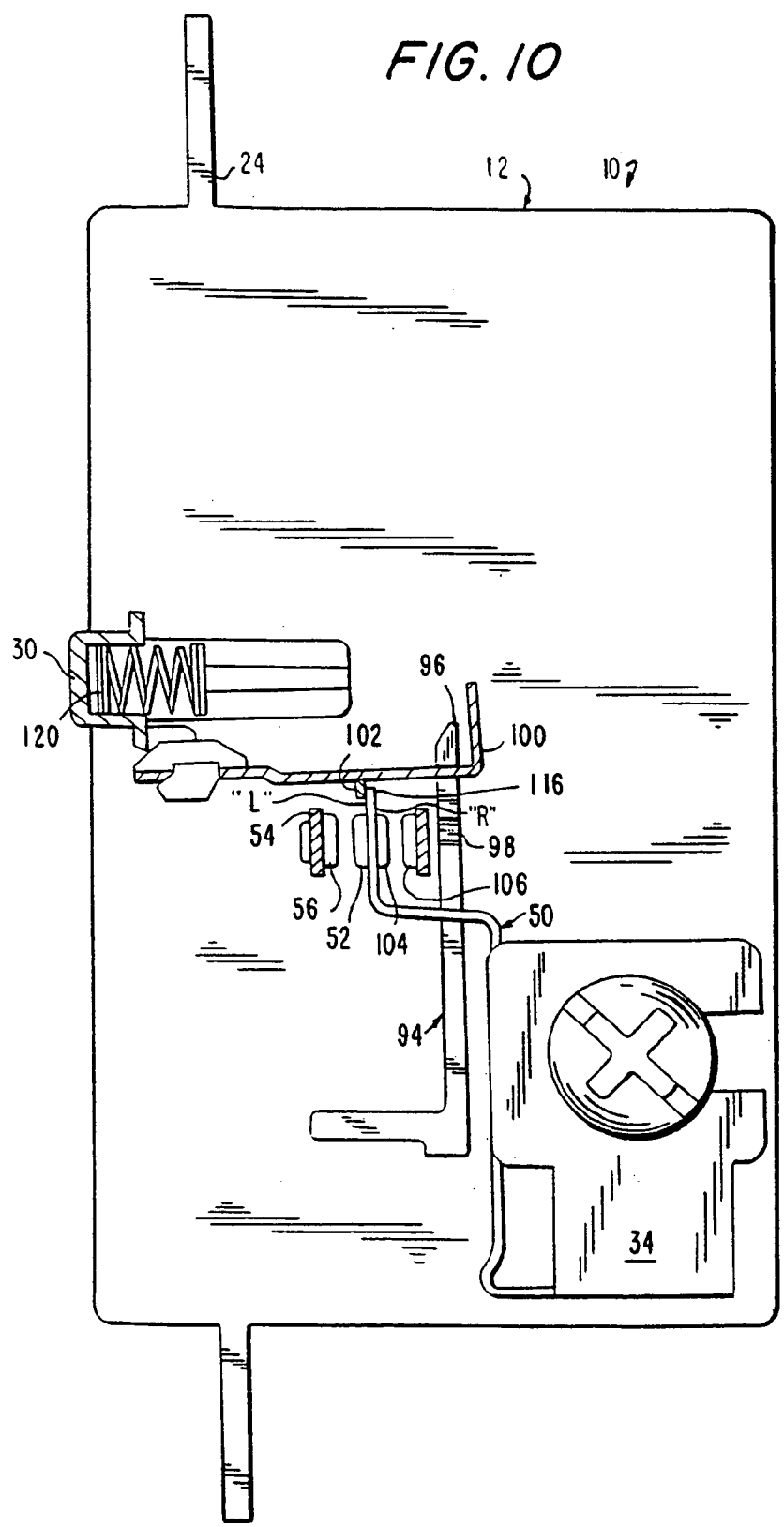

After tripping, the coil assembly 90 is de-energized so that spring 93 returns plunger 92 to its original extended position and banger 94 moves to its original position releasing latch member 100. At this time, the latch member 100 is in a lockout position where latch finger 102 inhibits movable contact 52 from engaging fixed contact 56, as seen in FIG. 10. As noted, one or both latching fingers 102 can act as an active inhibitor that prevents the contacts from touching. Alternatively, the natural bias of movable arms 50 and 70 can be used as a passive inhibitor that prevents the contacts from touching.

Figure 7:
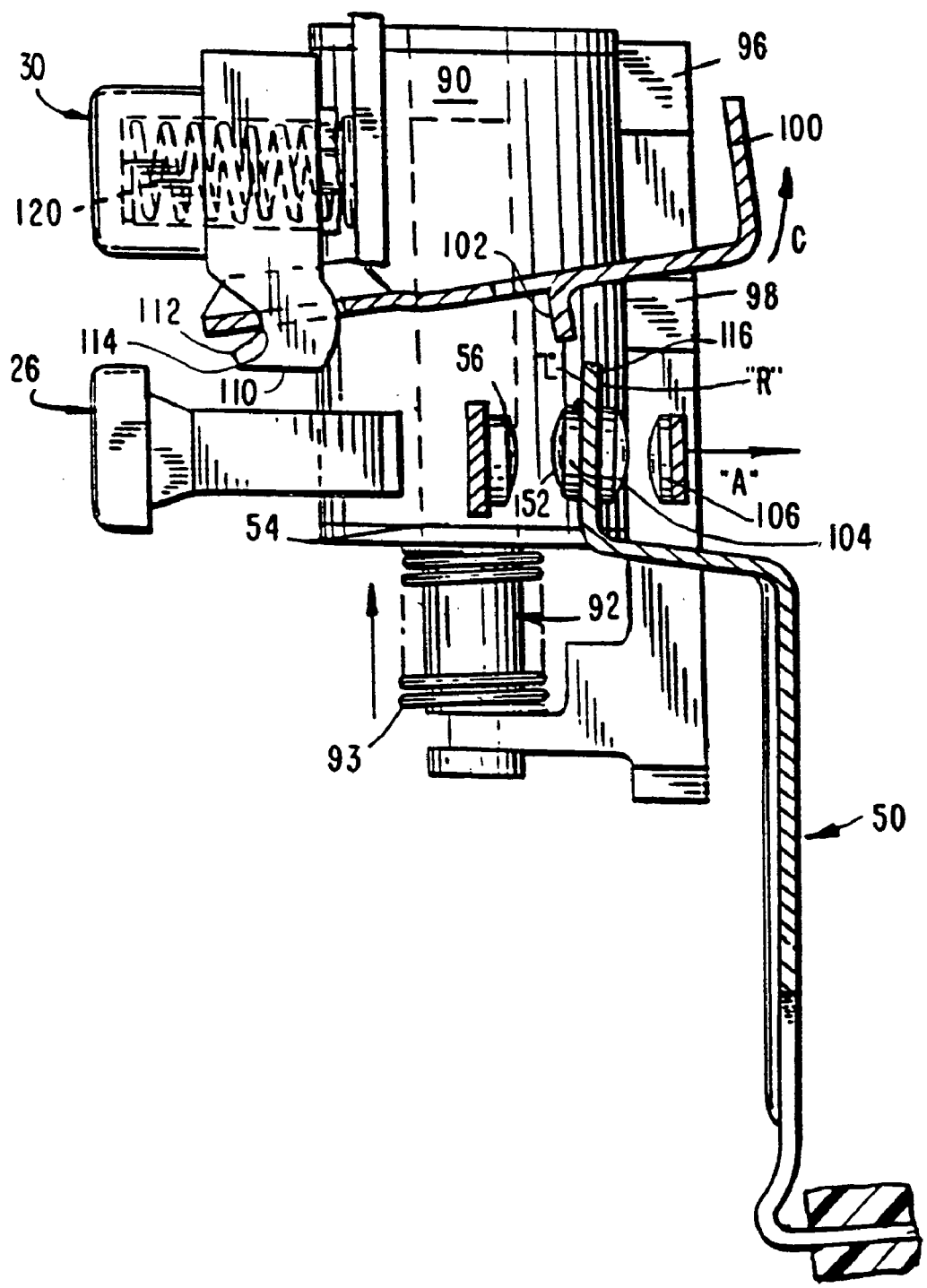
FIG. 7 is a side elevational view similar to FIG. 2, illustrating the GFCI device in a circuit breaking or interrupting position.
Figure 8:
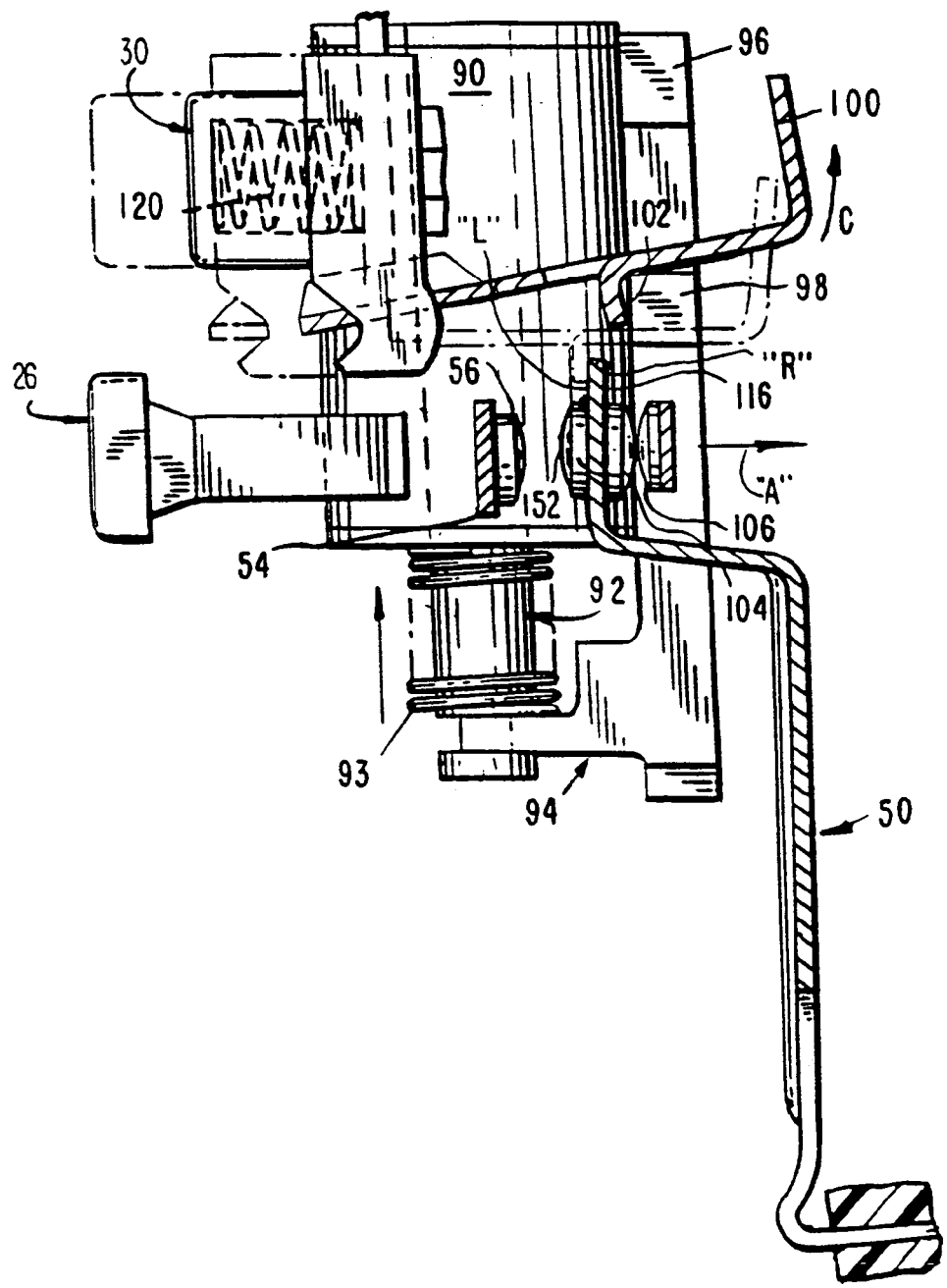
FIG. 8 is a side elevational view similar to FIG. 2, illustrating the components of the GFCI device during a reset operation.
Figure 11:
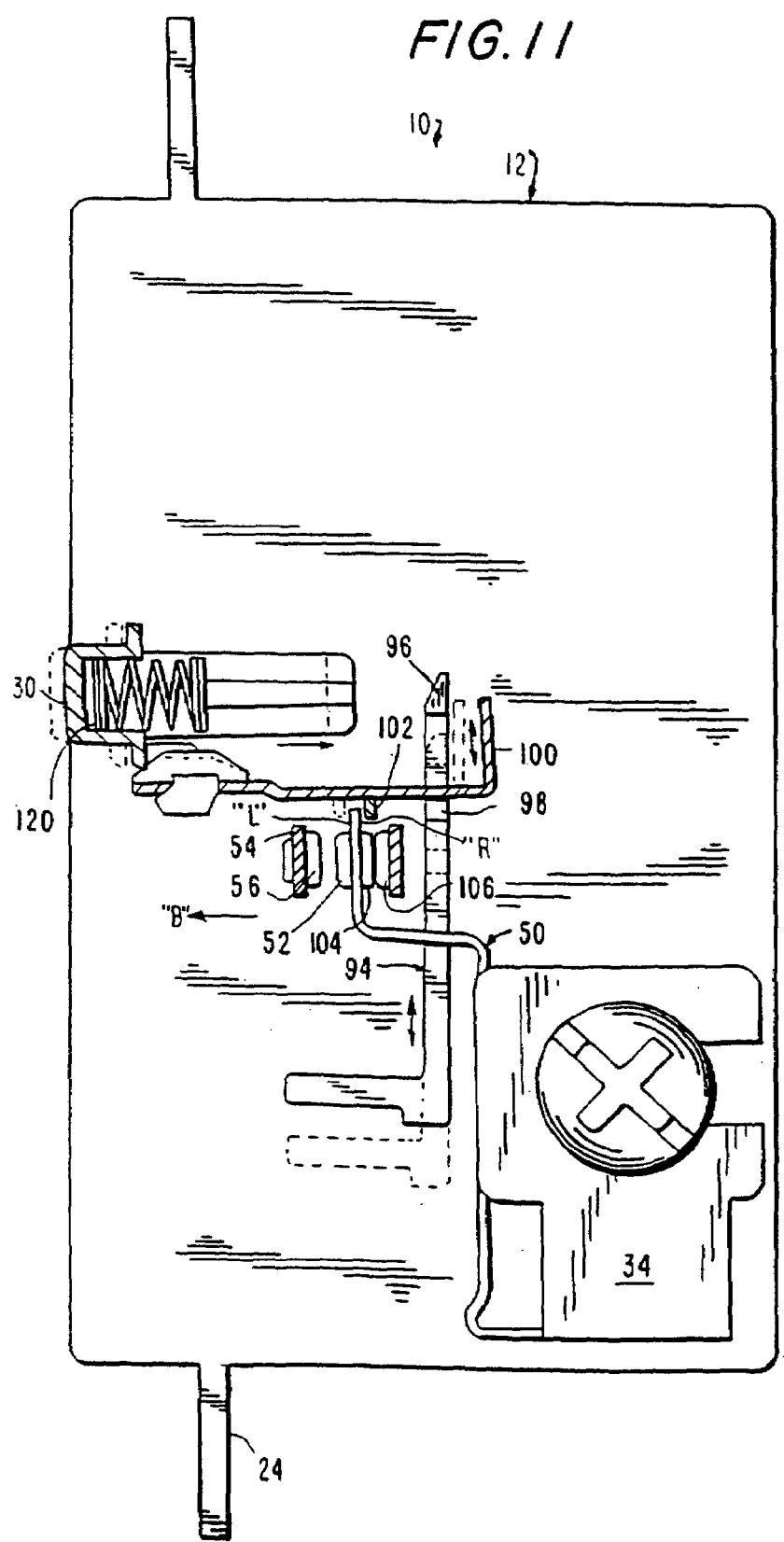

To reset the GFCI receptacle so that contacts 52 and 56 are closed and continuity in the phase conductive path is reestablished, the reset button 30 is depressed sufficiently to overcome the bias force of return spring 120 and move the latch member 100 in the direction of arrow A, seen in FIG. 8. While the reset button 30 is being depressed, latch finger 102 contacts side L of the movable contact arm 50 and continued depression of the reset button 30 forces the latch member to overcome the stress force exerted by the arm 50 causing the reset contact 104 on the arm 50 to close on reset contact 106. Closing the reset contacts activates the operation of the circuit interrupter by, for example simulating a fault, so that plunger 92 moves the banger 94 upwardly striking the latch member 100 which pivots the latch finger 102, while the latch member 100 continues to move in the direction of arrow A. As a result, the latch finger 102 is lifted over side L of the remote end 116 of the movable contact arm 50 onto side R of the remote end of the movable contact arm, as seen in FIGS. 7 and 11. Contact arm 50 returns to its unstressed position, opening contacts 52 and 56 and contacts 62 and 66, so as to terminate the activation of the circuit interrupting portion, thereby de-energizing the coil assembly 90.

Figure 9:
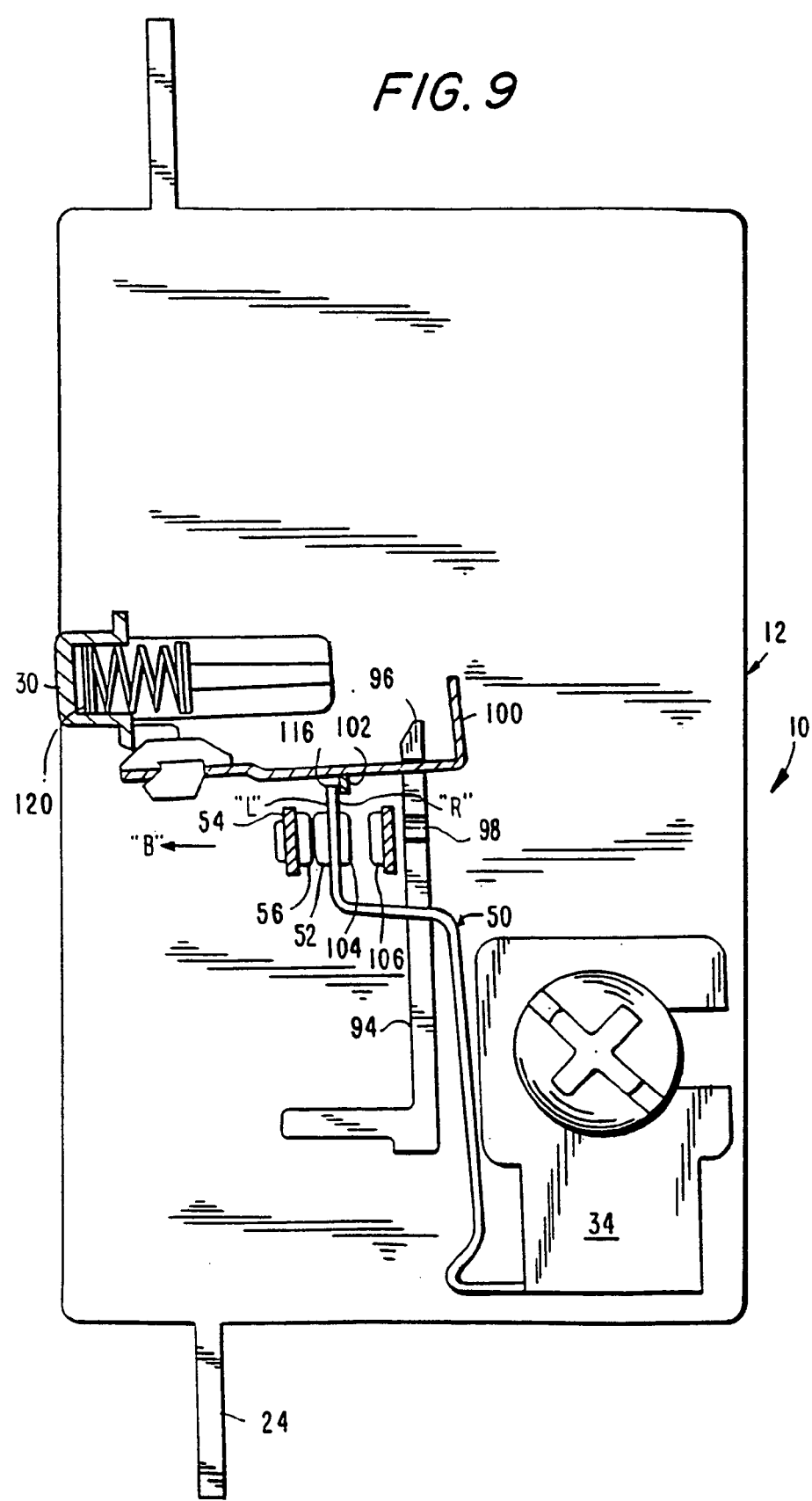
FIGS. 9–11 are schematic representations of the operation of one embodiment of the reset portion of the present application, illustrating a latching member used to make an electrical connection between line and load connections and to relate the reset portion of the electrical connection with the operation of the circuit interrupting portion.

After the circuit interrupter operation is activated, the coil assembly 90 is de-energized so that so that plunger 92 returns to its original extended position, and banger 94 releases the latch member 100 so that the latch finger 102 is in a reset position, seen din FIG. 9. Release of the reset button causes the latching member 100 and movable contact arm 50 to move in the direction of arrow B (seen in FIG. 9) until contact 52 electrically engages contact 56, as seen in FIG. 2.

As noted above, if opening and closing of electrical continuity in the neutral conductive path is desired, the above description for the phase conductive path is also applicable to the neutral conductive path.

In an alternative embodiment, the circuit interrupting devices may also include a trip portion that operates independently of the circuit interrupting portion so that in the event the circuit interrupting portion becomes non-operational the device can still be tripped. Preferably, the trip portion is manually activated and uses mechanical components to break one or more conductive paths. However, the trip portion may use electrical circuitry and/or electromechanical components to break either the phase or neutral conductive path or both paths.

For the purposes of the present application, the structure or mechanisms for this embodiment are also incorporated into a GFCI receptacle, seen in FIGS. 13–20, suitable for installation in a single-gang junction box in a home. However, the mechanisms according to the present application can be included in any of the various devices in the family of resettable circuit interrupting devices.

Figure 13:
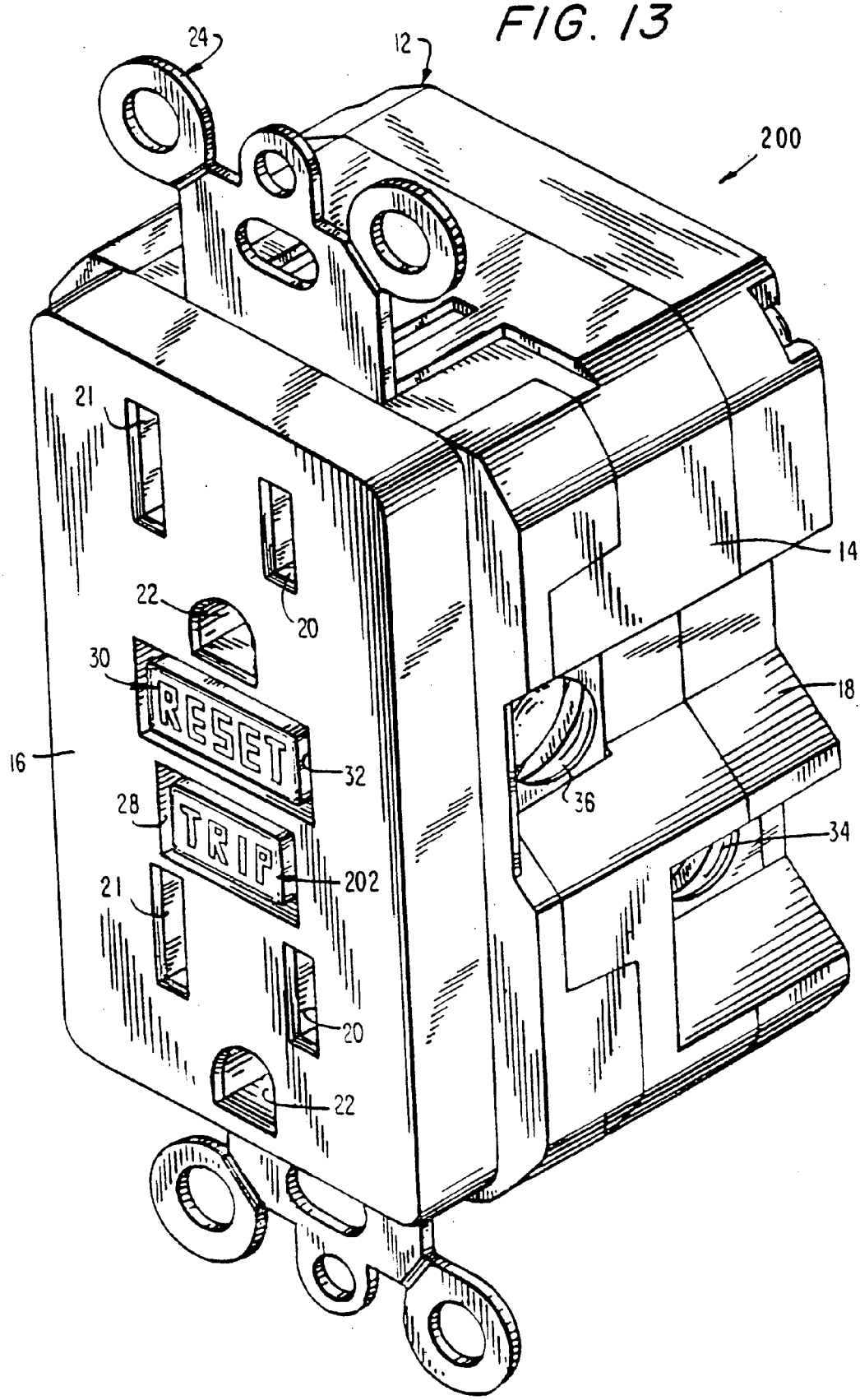
FIG. 13 is a perspective view of an alternative embodiment of a ground fault circuit interrupting device according to the present application.

Turning now to FIG. 13, the GFCI receptacle 200 according to this embodiment is similar to the GFCI receptacle described in FIGS. 1–12. Similar to FIG. 1, the GFCI receptacle 200 has a housing 12 consisting of a relatively central body 14 to which a face or cover portion 16 and a rear portion 18 are, preferably, removably secured.

A trip actuator 202, preferably a button, which is part of the trip portion to be described in more detail below, extends through opening 28 in the face portion 16 of the housing 12. The trip actuator is used, in this exemplary embodiment, to mechanically trip the GFCI receptacle, i.e., break electrical continuity in one or more of the conductive paths, independent of the operation of the circuit interrupting portion.

A reset actuator 30, preferably a button, which is part of the reset portion, extends through opening 32 in the face portion 16 of the housing 12. The reset button is used to activate the reset operation, which re-establishes electrical continuity in the open conductive paths, i.e., resets the device, if the circuit interrupting portion is operational.

As in the above embodiment, electrical connections to existing household electrical wiring are made via binding screws 34 and 36, where screw 34 is an input (or line) phase connection, and screw 36 is an output (or load) phase connection. It should be noted that two additional binding screws 38 and 40 (seen in FIG. 3) are located on the opposite side of the receptacle 200. These additional binding screws provide line and load neutral connections, respectively. A more detailed description of a GFCI receptacle is provided in U.S. Pat. No. 4,595,894, which is incorporated herein in its entirety by reference.

Referring to FIGS. 4–6, 14 and 17, the conductive paths in this embodiment are substantially the same as those described above. The conductive path between the line phase connection 34 and the load phase connection 36 includes, contact arm 50 which is movable between stressed and unstressed positions, movable contact 52 mounted to the contact arm 50, contact arm 54 secured to or monolithically formed into the load phase connection 36 and fixed contact 56 mounted to the contact arm 54 (seen in FIGS. 4, 5 and 17). The user accessible load phase connection for this embodiment includes terminal assembly 58 having two binding terminals 60 which are capable of engaging a prong of a male plug inserted therebetween. The conductive path between the line phase connection 34 and the user accessible load phase connection includes, contact arm 50, movable contact 62 mounted to contact arm 50, contact arm 64 secured to or monolithically formed into terminal assembly 58, and fixed contact 66 mounted to contact arm 64. These conductive paths are collectively called the phase conductive path.

Figure 4:
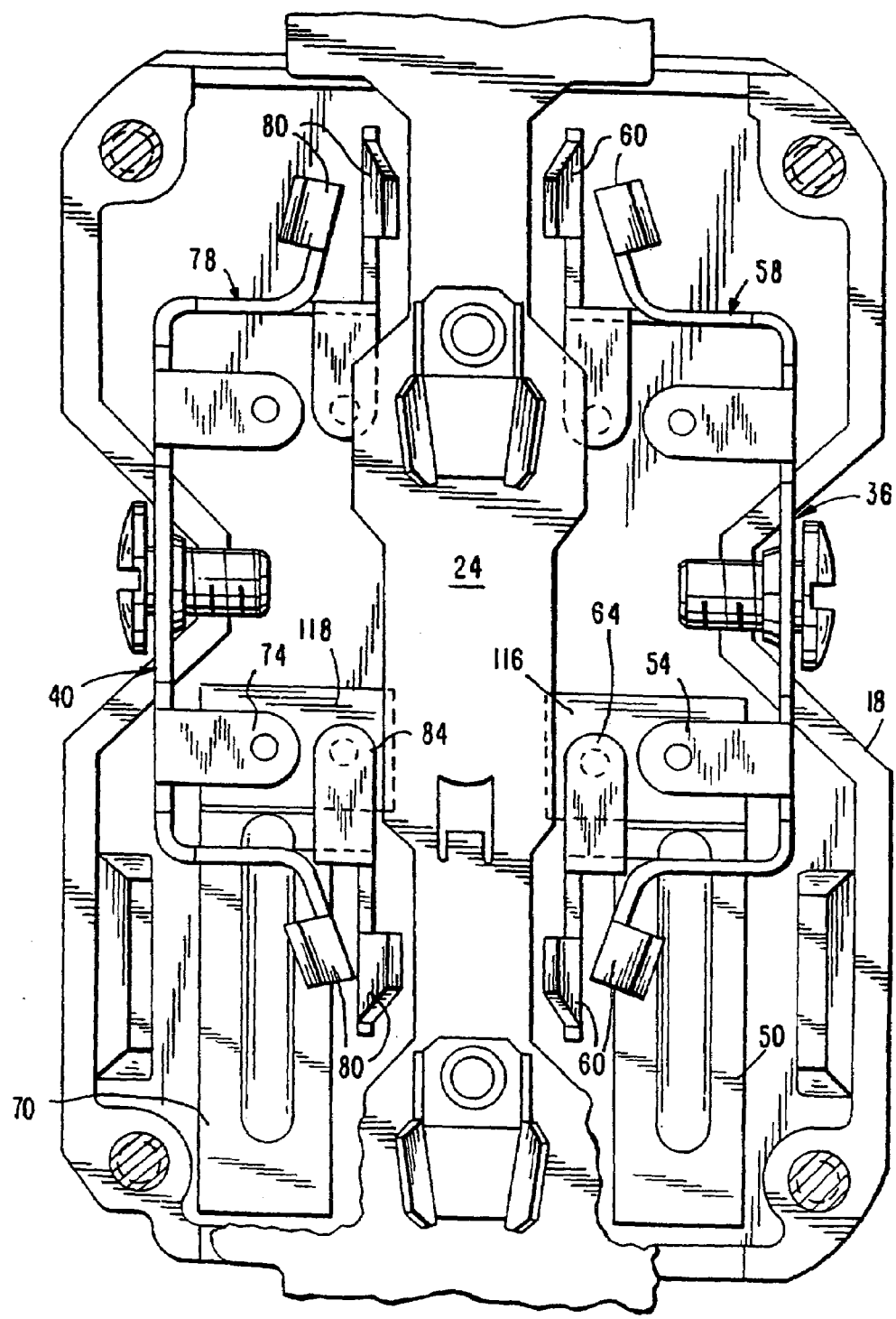
FIG. 4 is a plan view of portions of electrical conductive paths located within the GFCI device of FIG. 1.
Figure 6:
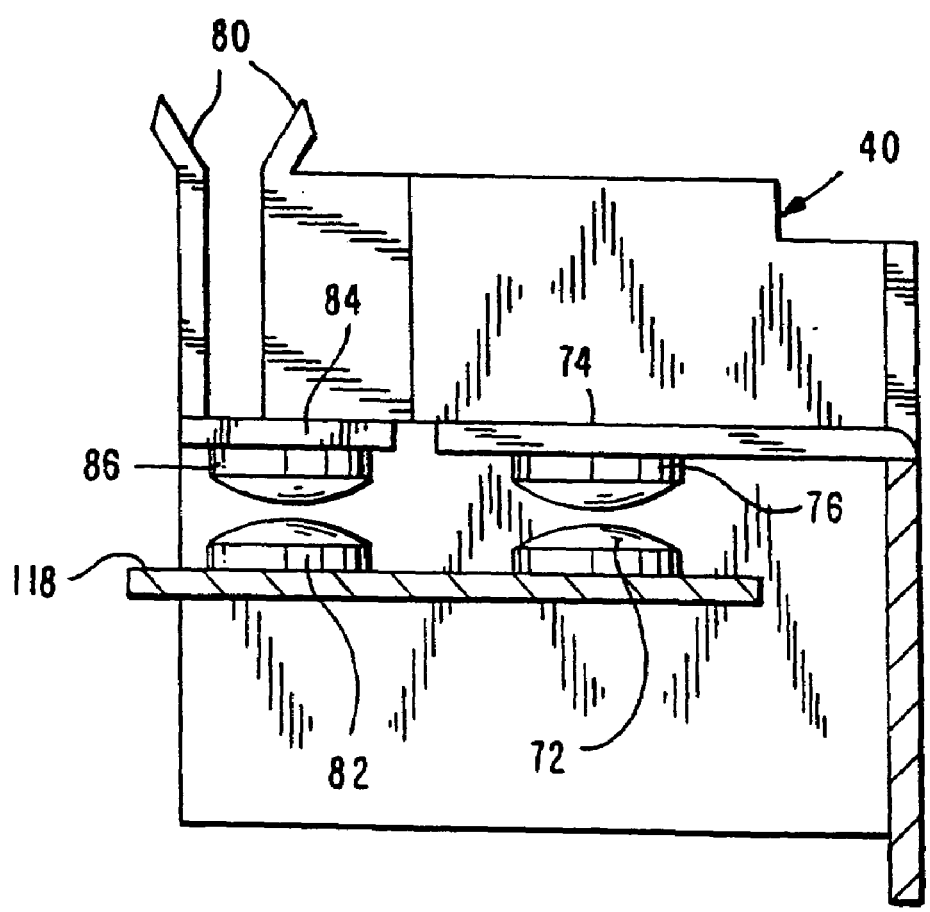
FIG. 6 is a partial sectional view of a portion of a conductive path shown in FIG. 4.
Figure 17:
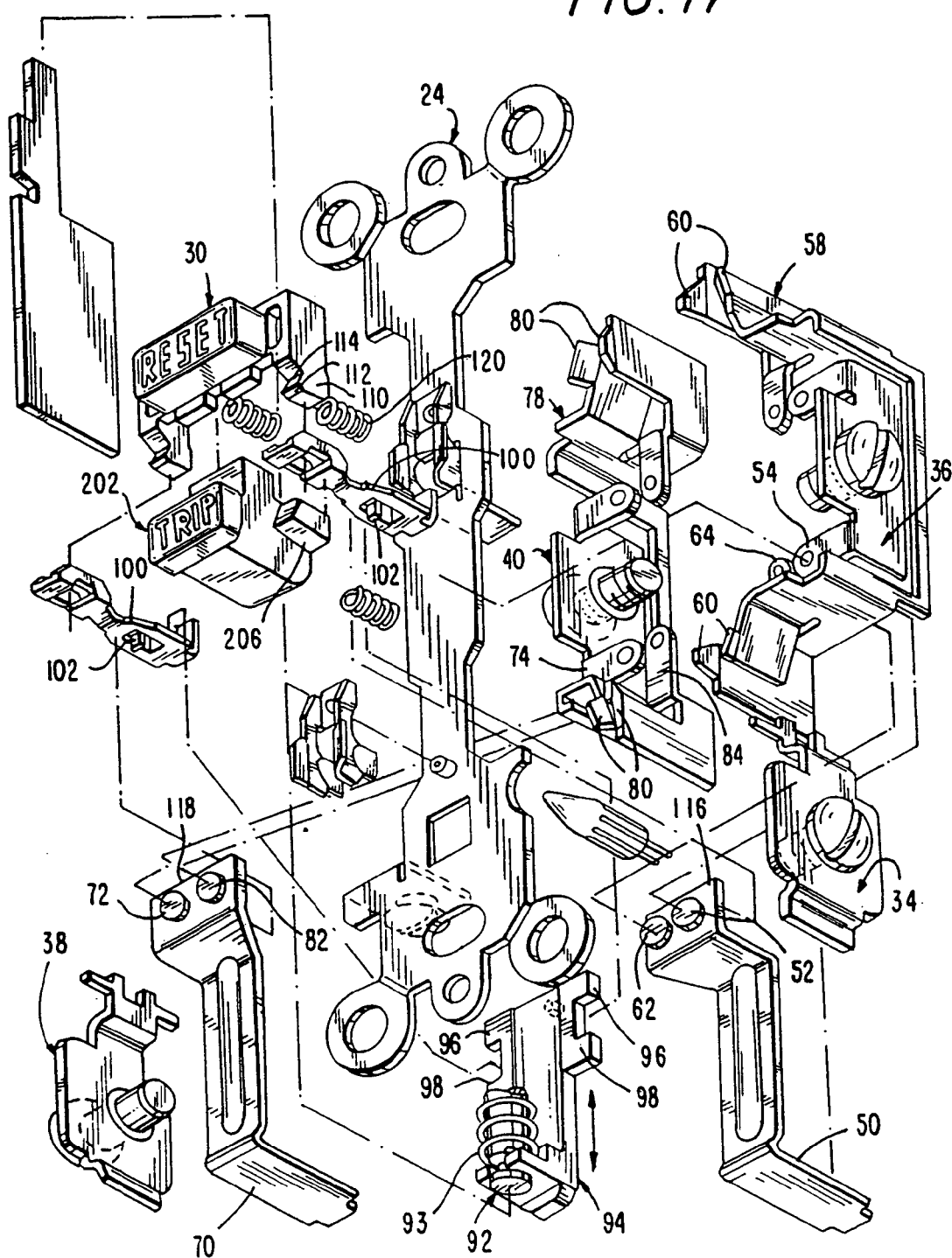
FIG. 17 is an exploded view of internal components of the GFCI device of FIG. 13.

Similarly, the conductive path between the line neutral connection 38 and the load neutral connection 40 includes, contact arm 70 which is movable between stressed and unstressed positions, movable contact 72 mounted to contact arm 70, contact arm 74 secured to or monolithically formed into load neutral connection 40, and fixed contact 76 mounted to the contact arm 74 (seen in FIGS. 4, 6 and 17). The user accessible load neutral connection for this embodiment includes terminal assembly 78 having two binding terminals 80 which are capable of engaging a prong of a male plug inserted therebetween. The conductive path between the line neutral connection 38 and the user accessible load neutral connection includes, contact arm 70, movable contact 82 mounted to the contact arm 70, contact arm 84 secured to or monolithically formed into terminal assembly 78, and fixed contact 86 mounted to contact arm 84. These conductive paths are collectively called the neutral conductive path.

Figure 14:
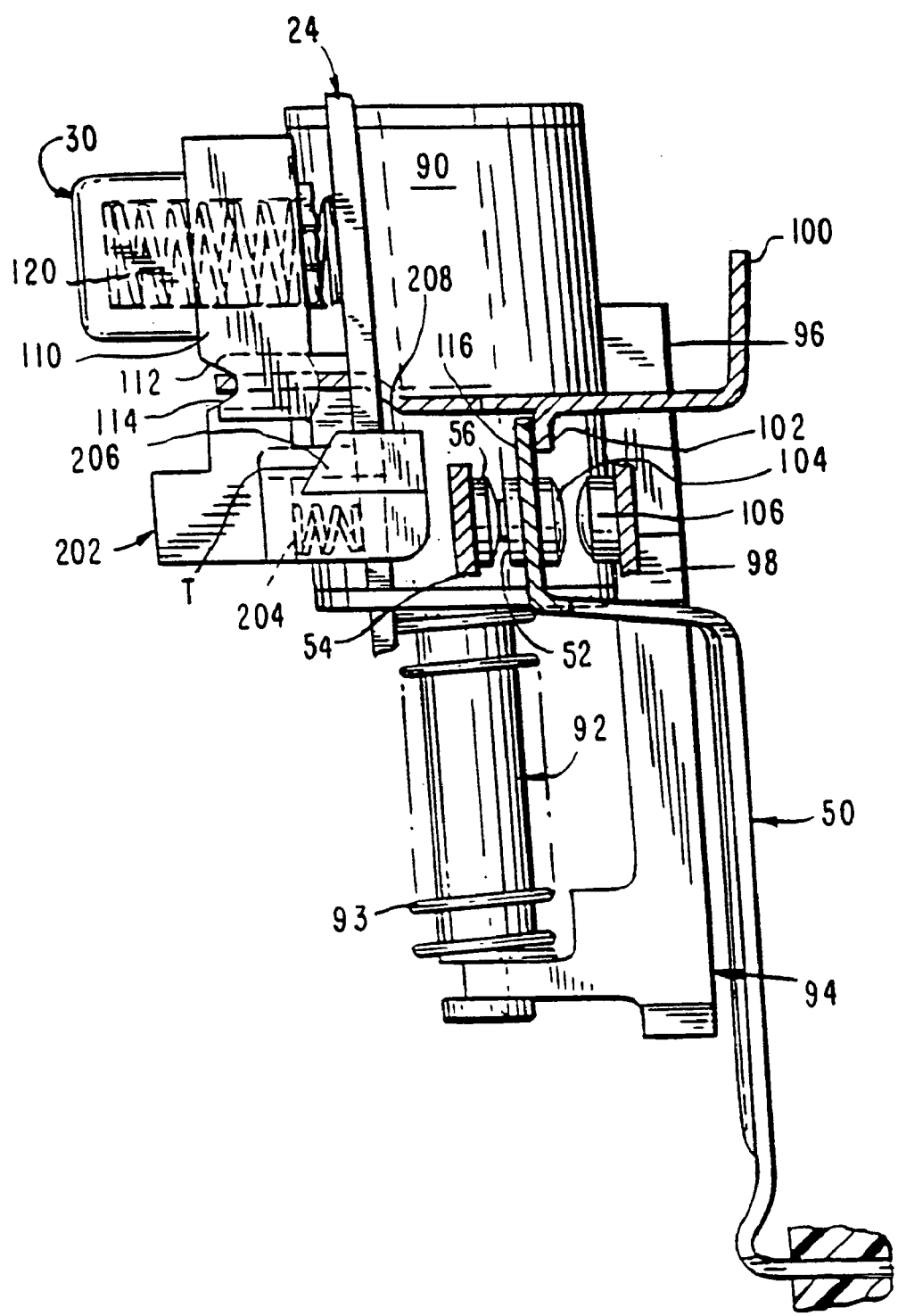
FIG. 14 is side elevational view, partly in section, of a portion of the GFCI device shown in FIG. 13, illustrating the GFCI device in a set or circuit making position.

There is also shown in FIG. 14, mechanical components used during circuit interrupting and reset operations according to this embodiment of the present application. Although these components shown in the drawings are electro-mechanical in nature, the present application also contemplates using semiconductor type circuit interrupting and reset components, as well as other mechanisms capable of making and breaking electrical continuity.

The circuit interrupting device according to this embodiment incorporates an independent trip portion into the circuit interrupting device of FIGS. 1–12. Therefore, a description of the circuit interrupting, reset and reset lockout portions are omitted.

Figure 15:
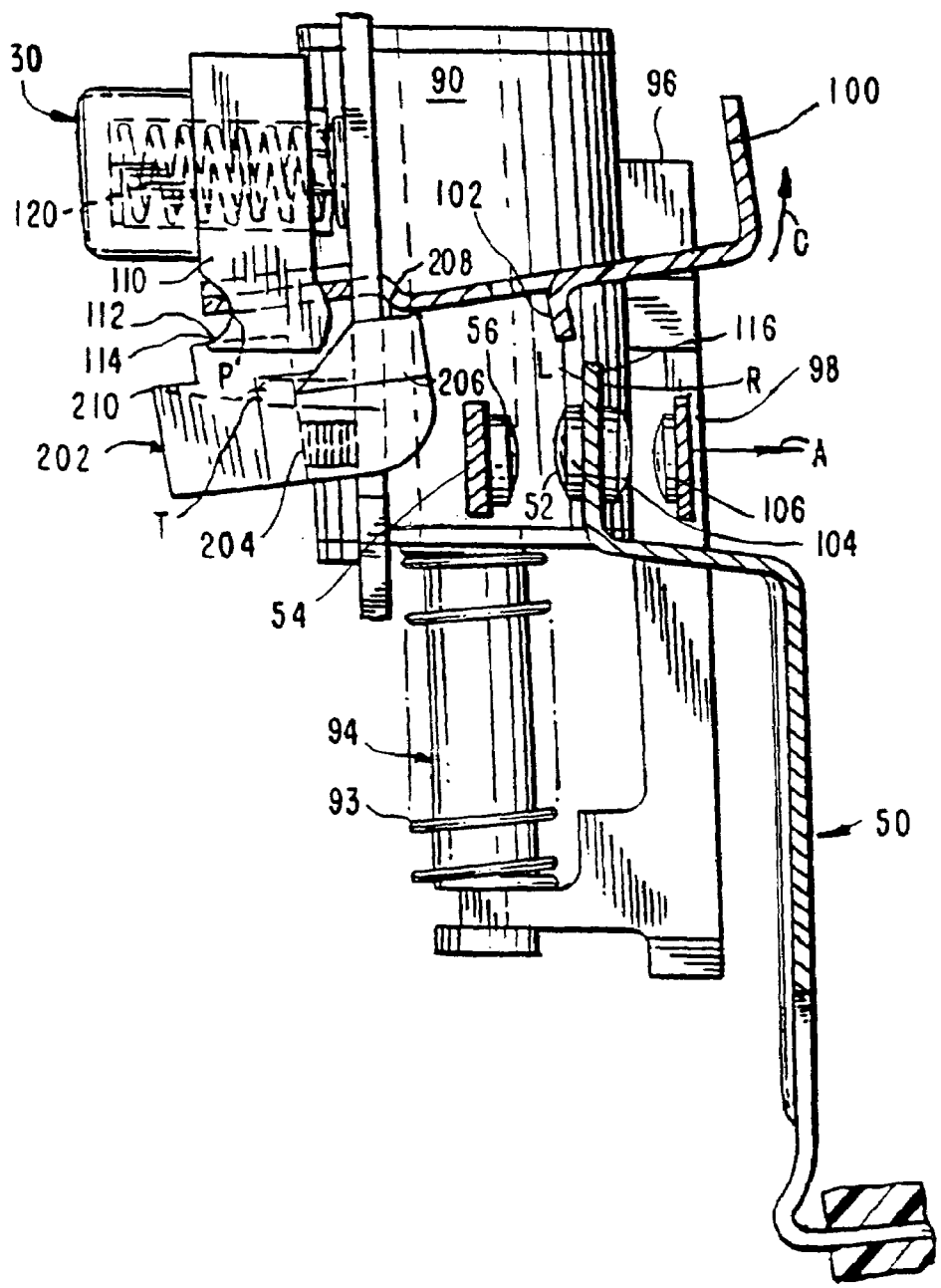
FIG. 15 is a side elevational view similar to FIG. 14, illustrating the GFCI device in a circuit breaking position.
Figure 16:
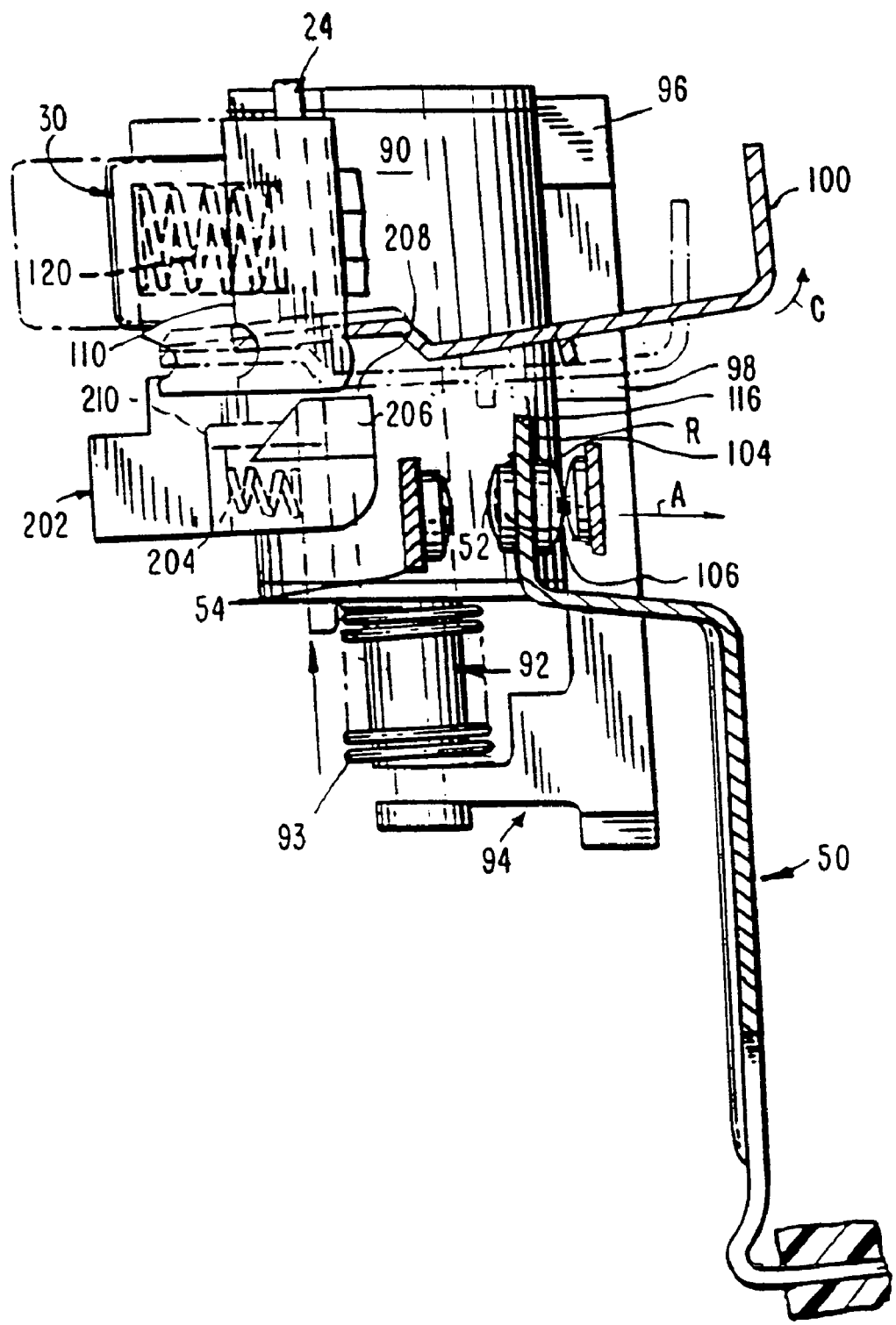
FIG. 16 is a side elevational view similar to FIG. 14, illustrating the components of the GFCI device during a reset operation.

Referring to FIGS. 14–16 an exemplary embodiment of the trip portion according to the present application includes a trip actuator 202, preferably a button, that is movable between a set position, where contacts 52 and 56 are permitted to close or make contact, as seen in FIG. 14, and a trip position where contacts 52 and 56 are caused to open, as seen in FIG. 15. Spring 204 normally biases trip actuator 202 toward the set position. The trip portion also includes a trip arm 206 that extends from the trip actuator 202 so that a surface 208 of the trip arm 206 moves into contact with the movable latching member 100, when the trip button is moved toward the trip position. When the trip actuator 202 is in the set position, surface 208 of trip arm 202 can be in contact with or close proximity to the movable latching member 100, as seen in FIG. 14. Of course the trip button may be labeled as a standard test button.

Figure 18:
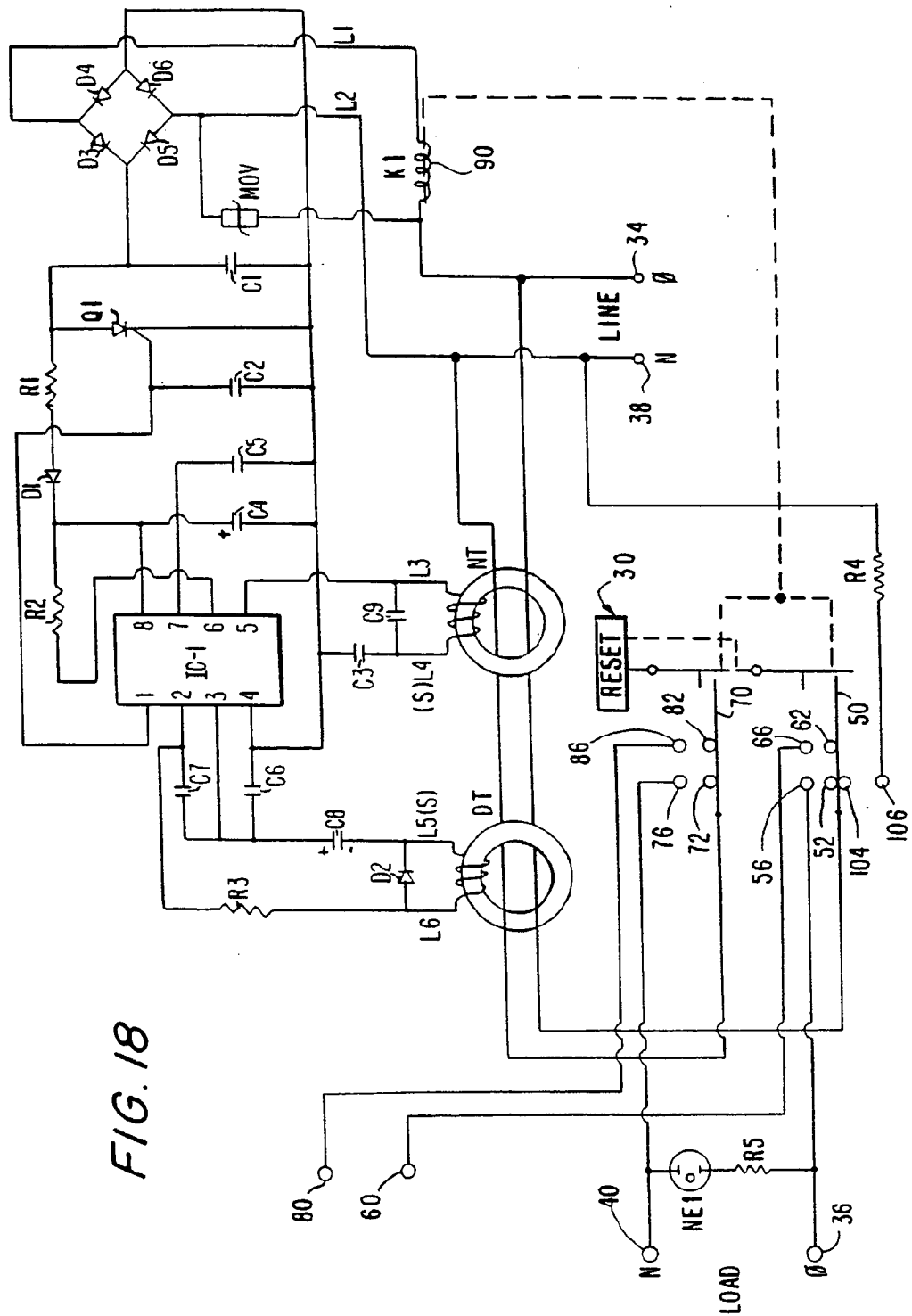
FIG. 18 is a schematic diagram of a circuit for detecting ground faults and resetting the GFCI device of FIG. 13.

In operation, upon depression of the trip actuator 202, the trip actuator pivots about point T of pivot arm 210 (seen in FIG. 15) extending from strap 24 so that the surface 208 of the trip arm 206 can contact the movable latching member 100. As the trip actuator 202 is moved toward the trip position, trip arm 206 also enters the path of movement of the finger 110 associated with reset button 30 thus blocking the finger 102 from further movement in the direction of arrow A (seen in FIG. 15). By blocking the movement of the finger 110, the trip arm 206 inhibits the activation of the reset operation and, thus, inhibits simultaneous activation of the trip and reset operations. Further depression of the trip actuator 202 causes the movable latching member 100 to pivot about point T in the direction of arrow C (seen in FIG. 15). Pivotal movement of the latching member 100 causes latching finger 102 of latching arm 100 to move out of contact with the movable contact arm 50 so that the arm 50 returns to its unstressed condition, and the conductive path is broken. Resetting of the device is achieved as described above. An exemplary embodiment of the circuitry used to sense faults and reset the conductive paths, is shown in FIG. 18.

As noted above, if opening and closing of electrical continuity in the neutral conductive path is desired, the above description for the phase conductive path is also applicable to the neutral conductive path.

Figure 19:
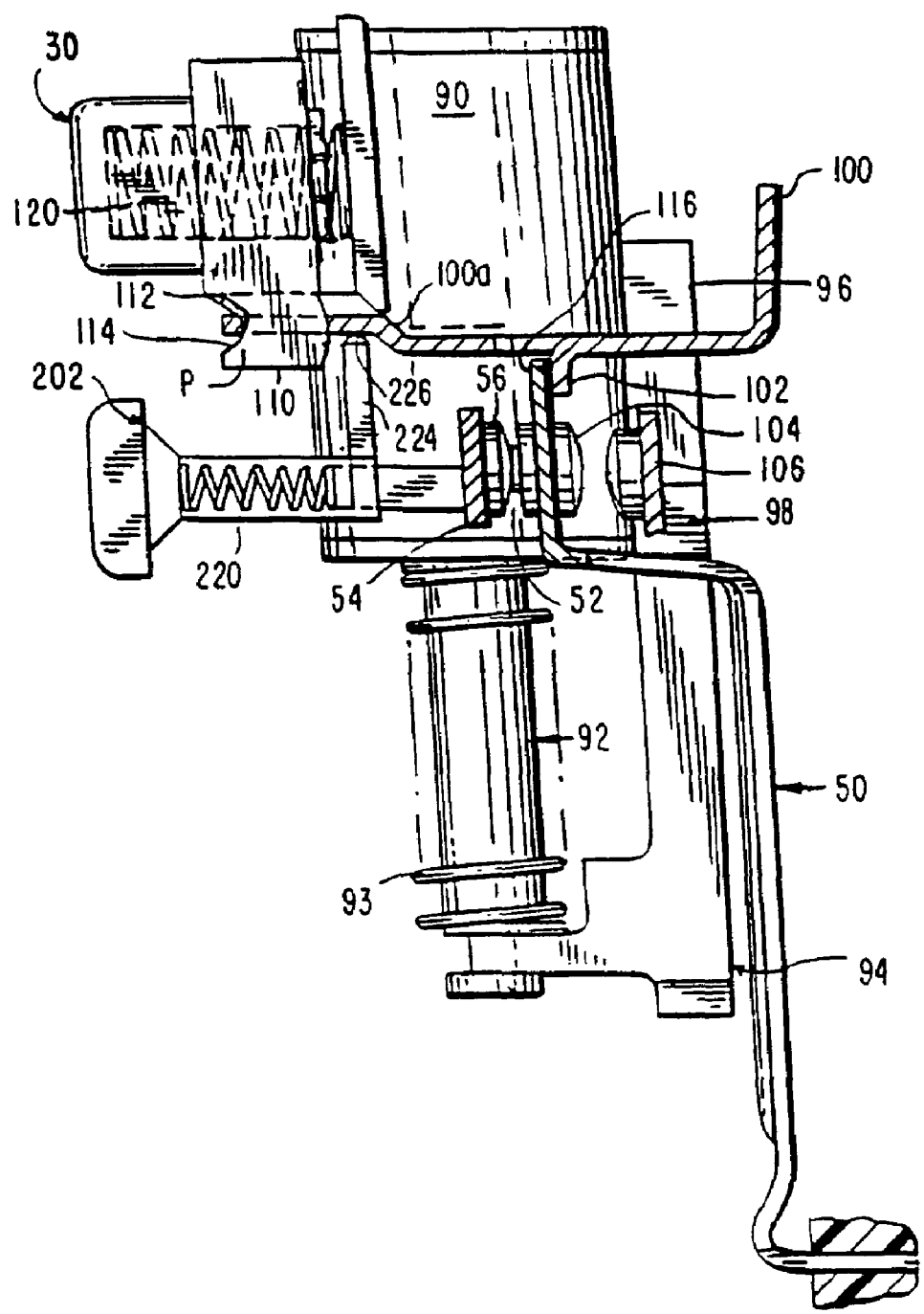
FIG. 19 is side elevational view, partly in section, of components of a portion of the alternative embodiment of the GFCI device shown in FIG. 13, illustrating the device in a set or circuit making position.
Figure 20:
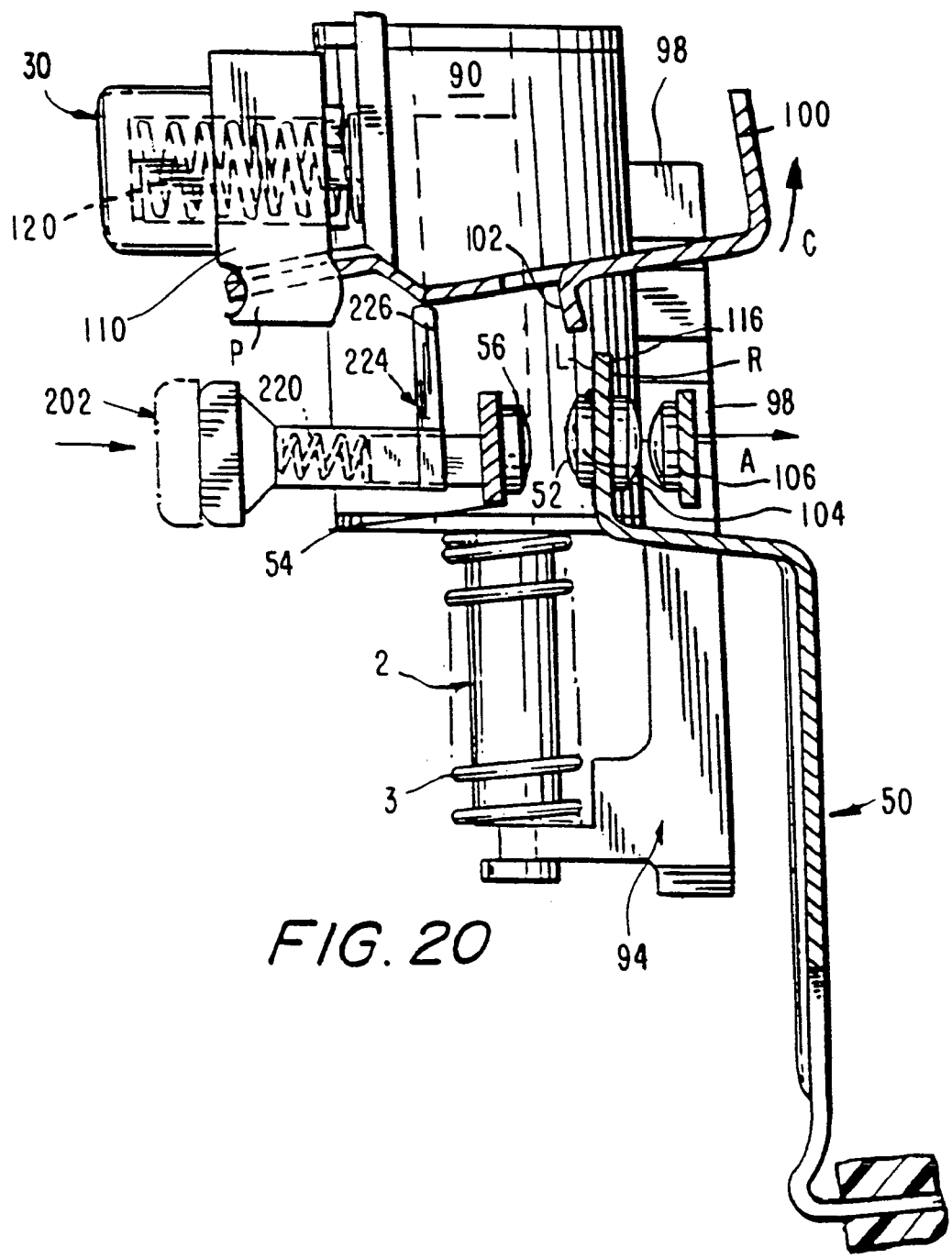
FIG. 20 is a side elevational view similar to FIG. 19, illustrating of the device in a circuit breaking position.

An alternative embodiment of the trip portion will be described with reference to FIGS. 19 and 20. In this embodiment, the trip portion includes a trip actuator 202 that at is movable between a set position, where contacts 52 and 56 are permitted to close or make contact, as seen in FIG. 19, and a trip position where contacts 52 and 56 are caused to open, as seen in FIG. 20. Spring 220 normally biases trip actuator 202 toward the set position. The trip portion also includes a trip arm 224 that extends from the trip actuator 202 so that a distal end 226 of the trip arm is in movable contact with the movable latching member 100. As noted above, the movable latching member 100 is, in this embodiment, common to the trip, circuit interrupting, reset and reset lockout portions and is used to make, break or lockout the electrical connections in the phase and/or neutral conductive paths.

In this embodiment, the movable latching member 100 includes a ramped portion 100a which facilitates opening and closing of electrical contacts 52 and 56 when the trip actuator 202 is moved between the set and trip positions, respectively. To illustrate, when the trip actuator 202 is in the set position, distal end 226 of trip arm 224 contacts the upper side of the ramped portion 100a, seen in FIG. 19. When the trip actuator 202 is depressed, the distal end 226 of the trip arm 224 moves along the ramp and pivots the latching member 60 about point P in the direction of arrow C causing latching finger 102 of the latching member 100 to move out of contact with the movable contact arm 50 so that the arm 50 returns to its unstressed condition, and the conductive path is broken. Resetting of the device is achieved as described above.

Figure 21:
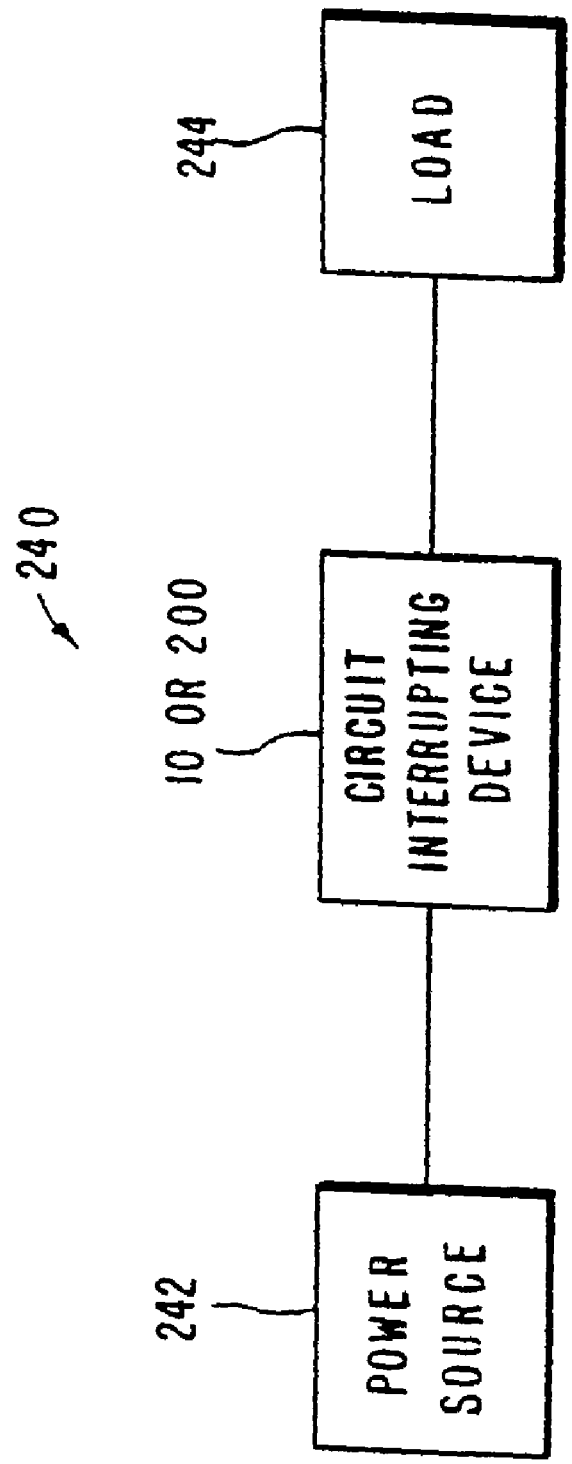
FIG. 21 is a block diagram of a circuit interrupting system according to the present application.

The circuit interrupting device according to the present application can be used in electrical systems, shown in the exemplary block diagram of FIG. 21. The system 240 includes a source of power 242, such as ac power in a home, at least one circuit interrupting device, e.g., circuit interrupting device 10 or 200, electrically connected to the power source, and one or more loads 244 connected to the circuit interrupting device. As an example of one such system, ac power supplied to single gang junction box in a home may be connected to a GFCI receptacle having one of the above described reverse wiring fault protection, independent trip or reset lockout features, or any combination of these features may be combined into the circuit interrupting device. Household appliances that are then plugged into the receptacle become the load or loads of the system.

A circuit interrupting device having a reset lockout device and a separate user load break point may be desirable.

Referring to FIGS. 22a–b, a prior art circuit interrupting device, GFCI 300 is shown. Predetermined condition sensor 310 will open switch devices 312, 314 in order to isolate the line Phase 302 and Neutral 306 from the Load, 304 and 308 respectively. As can be appreciated, when the device is reverse wired as shown in FIG. 22b, the user load, receptacle 320 is not protected by the sensor 310.

Figure 5:
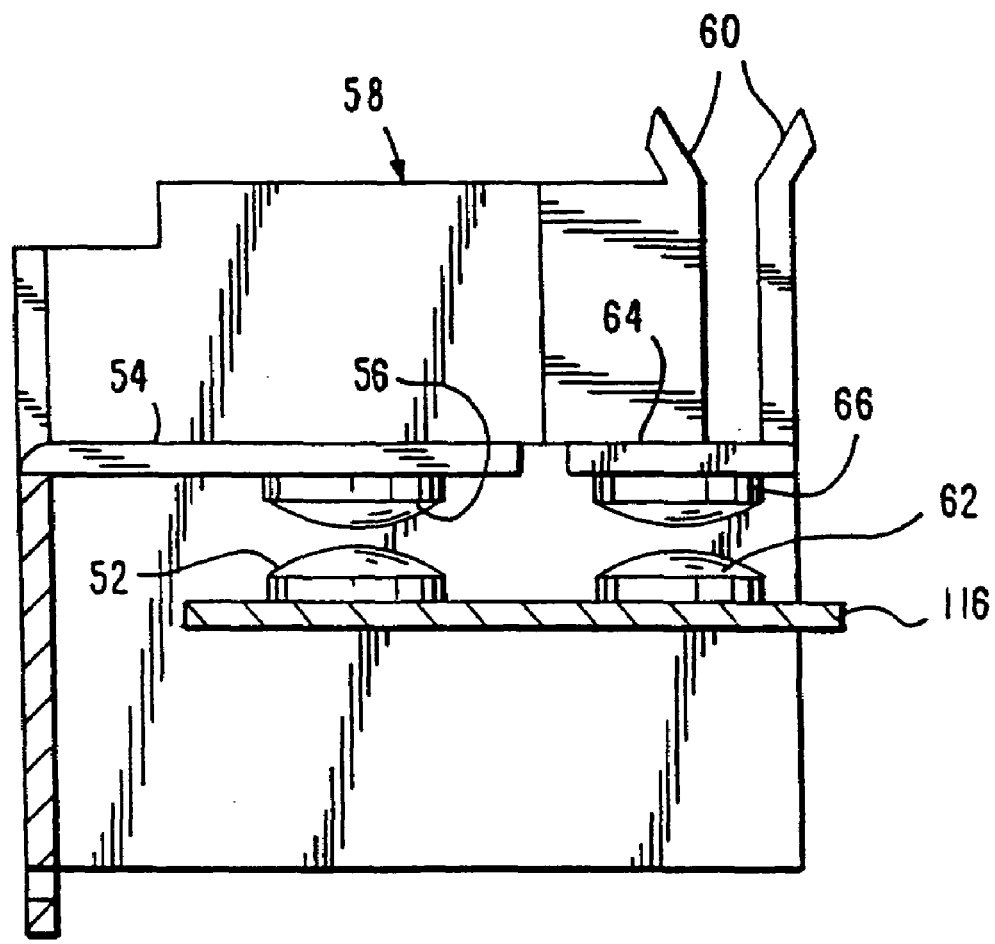
FIG. 5 is a partial sectional view of a portion of a conductive path shown in FIG. 4.

Referring to FIGS. 23a–b, portions of a circuit interrupting device according to another embodiment of the present invention is shown (GFCI 400). The device is properly wired in FIG. 23a and reverse wired in FIG. 23b. Predetermined condition sensor 410 will open switch devices 412, 414 in order to isolate the line Phase 402 and Neutral 406 from the Load, 404 and 408 respectively. As can be appreciated, when the device is reverse wired as shown in FIG. 23b, the user load, receptacle 420 is protected by the sensor 410 when the switch devices are tripped. As can be appreciated, if the device does not include a reset lock out, it may be reset, even though it is reverse wired. As shown in FIG. 5 also, a two contact switch 414 may be utilized to separately break the line connection 402, 406 from the load side 404, 408 and a user load 420. Such a configuration can be considered to be a bridge circuit, as shown in FIG. 24a, the configuration may include conductors crossing over in a bridge configuration.

As shown in FIGS. 1–12 and the corresponding detailed description above, a mechanical reset lock out device is provided.

As can be appreciated, multiple failure modes are anticipated for circuit interrupters and they may also be designed to protect against various faults. For instance, GFCIs generally protect against ground current imbalances. They generally protect against grounded neutrals by using two sensing transformers in order to trip the device when a grounded neutral fault occurs. As can be appreciated, a GFCI may protect against open neutrals. Such protection may be provided in corded GFCIs because the wires are flexed, whereas the receptacle GFCI is a fixed installation. Accordingly, as can be appreciated, an open neutral can be protected against by utilizing a constant duty relay solenoid switch powered across the phase and neutral of the line, for example, across 38 and 34 of FIG. 18. In such an instance, if power went out by the neutral opening, the constant duty coil would fire and open the phase and neutral line conductors.

The GFCI of an embodiment of the present invention also protects against reverse wiring.

Referring to FIGS. 24a–b, portions of a circuit interrupting device according to another embodiment of the present invention is shown (GFCI 401). The device is properly wired in FIG. 24a and reverse wired in FIG. 24b. Predetermined condition sensor 410 will open switch devices 412, 414 in order to isolate the line Phase 402 and Neutral 406 from the Load, 404 and 408 respectively. As can be appreciated, when the device is reverse wired as shown in FIG. 24b, the user load, receptacle 420 is protected by the sensor 410 when the switch devices are tripped. As can be appreciated, if the device does include a reset lock out, it may not be reset, even though it is reverse wired. The reset lock out will test the device be moving contact 414 to 422 along A-B such that a circuit through current limiting resistor 424 is established and picked up be sensor 410, preferably a toroid coil. Because a two contact switch 414 is utilized to separately break the line connection 402, 406 from the load side 404, 408 and a user load 420, when reverse wired as in FIG. 24b, the reset lockout test across resistor 424 will not work because the power from the line is isolated by switch 414.

Figure 25A:
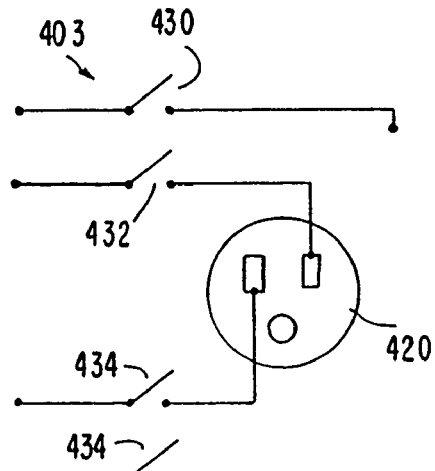
FIG. 25*a* is a partial schematic diagram of a GFCI according to an another embodiment of the present invention utilizing two single pole single throw switch devices per line.
Figure 25B:
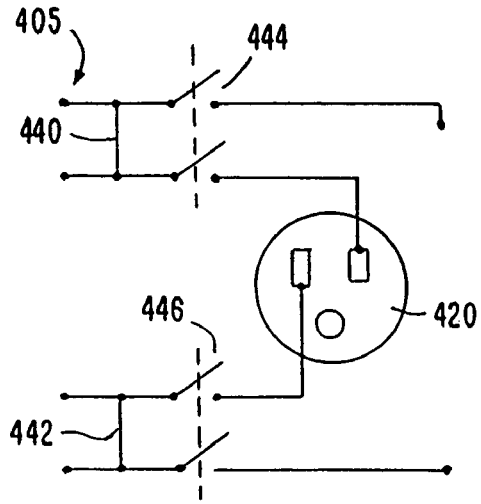
FIG. 25*b* is a partial schematic diagram of a GFCI according to an another embodiment of the present invention utilizing a dual pole single throw switch device with one end shorted per line.

Referring to FIGS. 25a–b, circuit interrupting devices 403, 405 according to other embodiments of the invention may utilize a bridge circuit in varying configurations. For example, device 403 preferably utilized two single pole, single throw mechanical switches 430, 432 to isolate a line. Other switch devices including semiconductor switches may be used. Furthermore, device 405 utilizes a ganged double pole, single throw switch with one end tied together 444.

Figure 26:
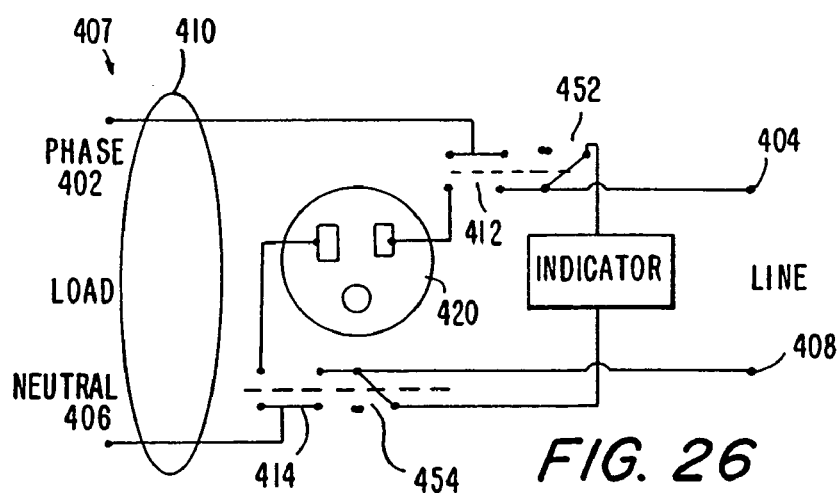
FIG. 26 is a partial schematic diagram of a GFCI according to an another embodiment of the present invention utilizing an indicator.

Referring to FIG. 26, a circuit interrupting device 407 according to another embodiment of the present invention preferably includes an indicator for providing an indication of a reverse wiring condition. As can be appreciated, the device 407 with a circuit bridge and reset lock out may have a user load 420 protected and open from the source of power. The user load may be a receptacle 420. However, it may be desirable to provide an indication of a reverse wiring condition even if the device is tripped and "safe." Such an indication may relieve user frustration in ascertaining a problem. Accordingly, this embodiment utilizes switches 452 and 454 that operate to connect indicator 450 to the side of the circuit interrupter that normally has the load (404 and 408). Switches 452 and 454 are preferably mechanical switches ganged with switches 412 and 414 respectively. However, other switch devices such as semiconductor switches may be used. If device 407 is reverse wired as shown and the device is tripped, switches 452 and 454 will signal indicator 450 to activate. The switches preferably switch power to the indicator that is preferably includes a neon lamp. However, other indicators such as audio, visual or communication indicators may be used. Similarly, the indicator 450 may be powered from a source other than the source of power to the circuit interrupting device and may be battery powered and may receive only an activate signal from switches 452 and 454.

In embodiments of the present invention utilizing a mechanical lock out mechanism, the device may be manufactured such that the circuit interrupter is provided to a user in a reset lock out state.

Figure 28A:
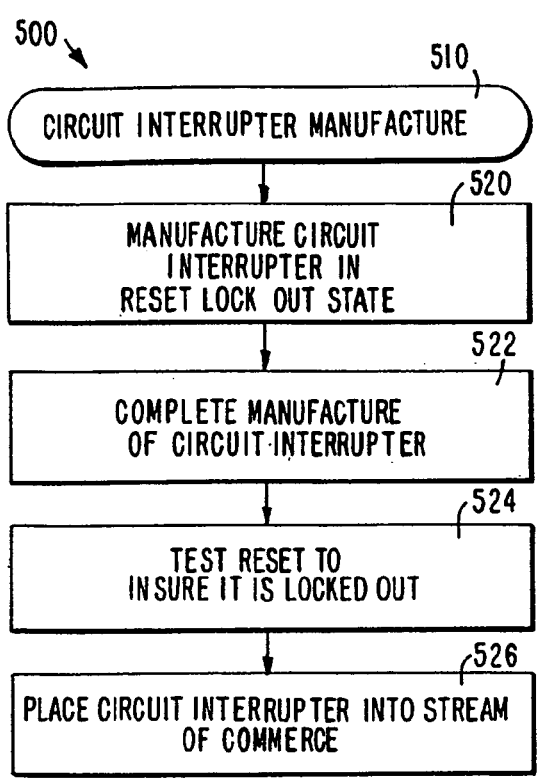
FIGS. 28a–c are flow charts of methods to prepare a circuit interrupting device according to embodiments of the present invention.

Referring to FIG. 28*a*, a method of preparing a circuit interrupting device is provided 500. As shown, a circuit interrupting device may be manufactured 510 such that the circuit interrupting device is manufactured in a reset lock out state 520. The device manufacture is completed 522. Optionally, the reset button is tested when the device is not powered to ensure that reset is not possible 524. Thereafter the device 400 may be placed in the stream of commerce 526.

Figure 28B:
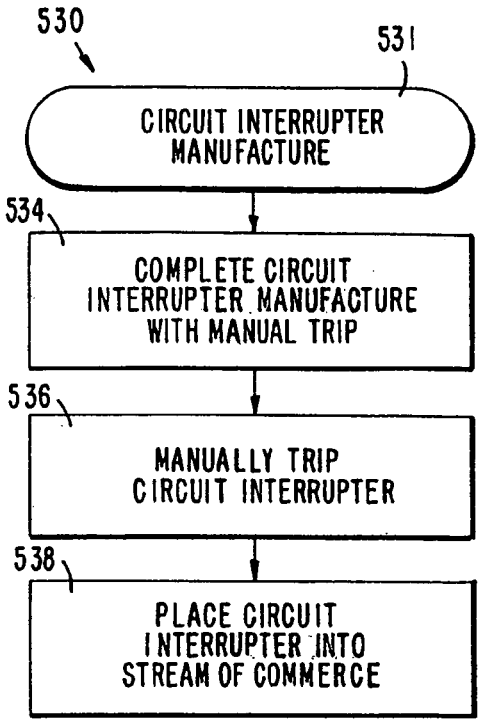

Referring to FIG. 28*b*, a method of preparing a circuit interrupting device is provided 500. As shown, a circuit interrupting device may be manufactured 510 such that the circuit interrupting device is manufactured in a reset lock out state 520. The device manufacture is completed 522. Optionally, the reset button is tested when the device is not powered to ensure that reset is not possible 524. Thereafter the device 400 may be placed in the stream of commerce 526.

Figure 27:
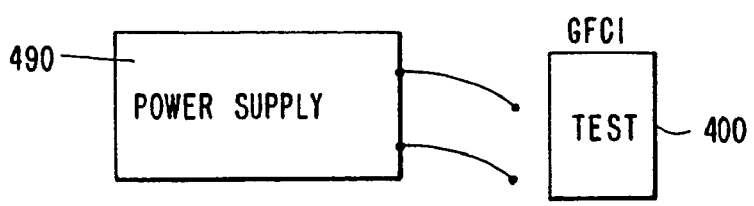
FIG. 27 is a partial schematic diagram of a test connection used to configure a GFCI according to an embodiment of the present invention.
Figure 28C:
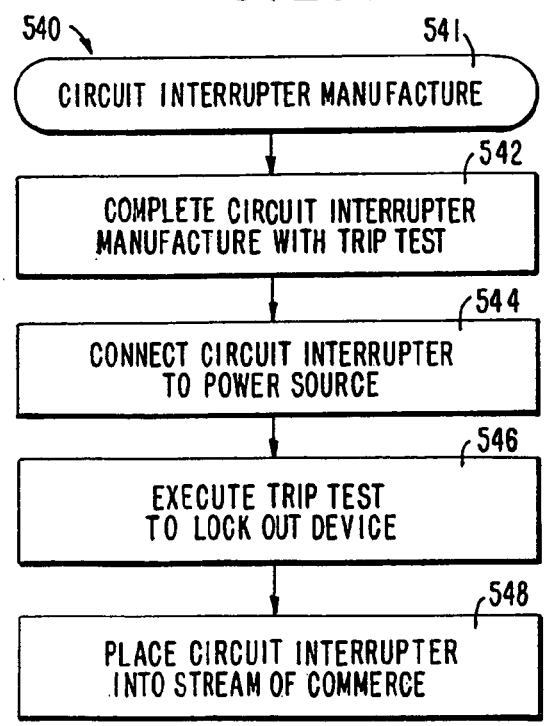

Referring to FIGS. 27 and 28*c*, a method of preparing a circuit interrupting device is provided. A lock out set apparatus such as a test mock up in order to achieve a lock out state may be used before the circuit interrupting device is delivered into the stream of commerce. For example, a GFCI circuit interrupter that has a test mechanism, a reset lock out mechanism and a bridge reverse wiring user load protection mechanism as described above may be manufactured and connected to a power source. The test mechanism may be initiated in order to set the reset lock out mechanism to the lock out state. The GFCI circuit interrupter is then delivered into the stream of commerce in the reset lock out state. As can be appreciated, Quality assurance steps may be performed and the manufacture in a tripped state may be part of a quality assurance task. As shown, a circuit interrupting device such as GFCI 400 may be connected to a test power supply 490 in order to preset the device into a reset lock out state before shipping it to users. A method of ensuring the device is shipped in the reset lock out state is described 540. During manufacture 541 of the device 400, a test button is provided 542. After manufacture, a power source 490 is connected to the device 544. The trip test is activated to trip the device, thereby setting a reset lock out state 546. Thereafter the device 400 may be placed in the stream of commerce 548. For example, a quality assurance task may be done with or about 544.

Figure 29:
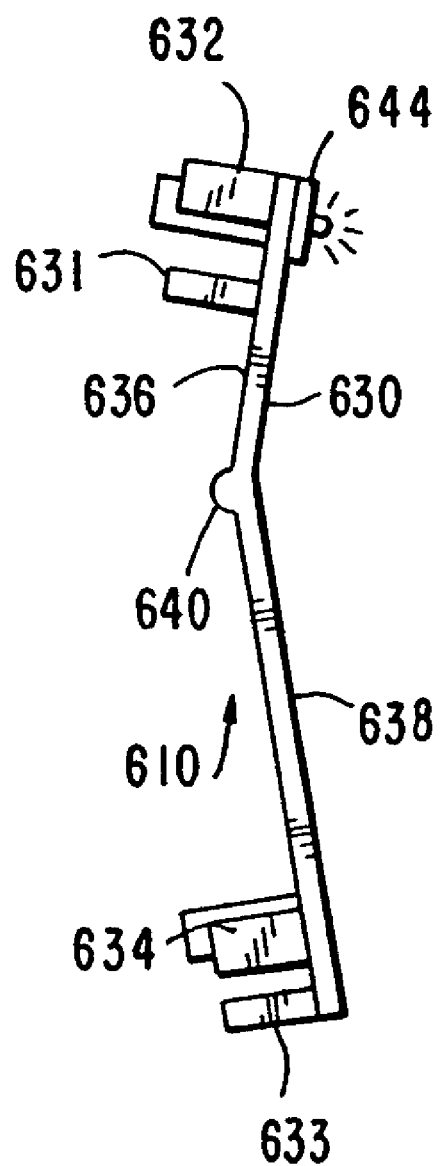
FIG. 29 is a perspective view of a trip force device according to an embodiment of the present invention.

Referring to FIGS. 1 and 29, a trip force device 610 is provided. As shown, the device has a body 638 capable of exerting force on a trip force protrusion 640 when the trip force device is inserted into a receptacle of a circuit interrupting device 10. As can be appreciated, prongs 631, 632, 633 and, 634 may be inserted into a circuit interrupting device 10 such that protrusion 640 will depress test button 26. Accordingly, the device 10 will be set to trip when installed. The device 10 may be fitted with such a trip force device 610 before it is placed into the stream of commerce.

An embodiment that may be described with reference to FIG. 1, is a circuit interrupting device having a face or cover portion 16 and a test button 26. A removable test force tab (not shown) may be attached or molded into cover 16. When a user installed the circuit interrupting device 10, the device would be tripped and a reset lock out state thereby necessarily set. Thereafter, the removable test force tab may be removed and the device will only reset if the circuit interrupter is operational, an open neutral condition does not exist and the device is not reverse wired.

As can be appreciated, if a reset lock out device utilizes electronic means such as nonvolatile memory to store a state condition variable, such device may be manufactured in the reset lock out state or initialized to such a state before delivery.

As noted, although the components used during circuit interrupting and device reset operations are electromechanical in nature, the present application also contemplates using electrical components, such as solid state switches and supporting circuitry, as well as other types of components capable or making and breaking electrical continuity in the conductive path.

While there have been shown and described and pointed out the fundamental features of the invention, it will be understood that various omissions and substitutions and changes of the form and details of the device described and illustrated and in its operation may be made by those skilled in the art, without departing from the spirit of the invention.

The invention claimed is:

1. A method for distributing a circuit interrupting device having a circuit interrupting portion with a circuit interrupter, and a reset portion in a housing comprising the steps of:

setting said circuit interrupting device to a tripped state, said circuit interrupting device having, within the housing, a first electrical conductor capable of being electrically connected to a source of electricity; a second electrical conductor capable of conducting electrical current to a load when electrically connected to said first electrical conductor; a third electrical conductor capable of being electrically connected to user accessible plugs and/or receptacles where the first, second and third electrical conductors are electrically isolated from each other; at least one movable bridge electrically connected to the first electrical conductor, said at least one movable bridge capable of electrically connecting the first, second and third electrical conductors to each other;

said circuit interrupter portion having a circuit interrupter eleetromechanically coupled to the at least one movable bridge, which circuit interrupter when energized due to the occurrence of a predetermined condition, is capable of engaging said movable bridge causing electrical discontinuity between said first, second and third electrical conductors;

said reset portion being coupled to the circuit interrupting portion, and when said reset portion is activated, is capable of energizing the circuit interrupter which engages the at least one movable bridge causing electrical continuity between the first, second and third electrical conductors to be reestablished whereby continuity between the first, second and third electrical conductors is not reestablished when the activated reset portion is not capable of energizing the circuit interrupter; and placing said tripped circuit interrupting device into the stream of commerce.

2. The method of claim 1 for distributing a circuit interrupting device further comprising the step of:

testing reset lockout portion before placing the circuit interrupting device into the steam of commerce.

3. The method of claim 1, wherein said reset lockout portion is adapted to be selectively electrically powered by the phase conductive path.

4. The method of claim 1, wherein said circuit interrupting device further comprises a mechanically operated mechanism for tripping said circuit interrupting device.

5. A method for distributing a circuit interrupting device having a reset lockout portion, sensing circuitry to sense the occurrence of a predetermined condition, and a circuit interrupting portion in a housing comprising the steps of:

setting said circuit interrupting device to a tripped state, said circuit interrupting device having, within the housing, a phase conductive path and a neutral conductive path between a line side and a load side; said phase conductive path terminating at a first connection capable of being electrically connected to a source of electricity, a second connection capable of conducting electricity to at least one load and a third connection capable of conducting electricity to at least one user accessible load; and said neutral conductive path terminating at a first connection capable of being electrically connected to a source of electricity, a second connection capable of providing a neutral connection to said at least one load and a third connection capable of providing a neutral connection to said at least one user accessible load;

said circuit interrupting portion coupled to said sensing circuitry and configured to trip the device to cause electrical discontinuity in said phase and neutral conductive paths between said line side and said load sides upon the occurrence of a predetermined condition;

said reset lockout portion being configured to reestablish electrical continuity in said phase or neutral conductive paths or both conductive paths upon being activated by electricity from said phase line side unless the circuit interrupting portion is not operating properly; and placing said tripped circuit interrupting device into a stream of commerce.

6. A method of distributing an electrical wiring device capable of being installed in cooperation with a current carrying electrical circuit, said electrical wiring device including a reset lockout capability having a circuit interrupting portion disposed within a housing, said method comprising the steps of:

receiving said electrical wiring device in a (ripped state, said circuit interrupting portion including within the housing a phase conductive path and a neutral conductive path between a line side and a load side, said phase conductive path including a portion thereof terminating at a first electrical conducting connector which is capable of being in electrical communication with a source of electricity, a second electrical conducting connector capable of being in electrical communication with at least one load, and a third electrical conducting connector capable of being in electrical communication with at least one user accessible load, said neutral conductive path including a portion thereof terminating at a fourth electrical conducting connector capable of being in electrical communication with a source of electricity, a fifth electrical conducting connector capable of being in neutral electrical communication with said load, and a sixth electrical conducting connector capable of being in neutral electrical communication with said user accessible load, said circuit interrupting portion being capable of causing electrical discontinuity in said phase and neutral conductive paths intermediate said line and load sides upon the occurrence of a predetermined condition, said reset lockout capability preventing the establishment of electrical continuity in either said phase or neutral conductive paths or both conductive paths unless said reset lockout capability is operating properly, and distributing said electrical wiring device into a steam of commerce.

* * * * *

UNITED STATES PATENT AND TRADEMARK OFFICE
CERTIFICATE OF CORRECTION

| | | |
|---|---|---|
| PATENT NO. | : 7,049,910 B2 | Page 1 of 1 |
| APPLICATION NO. | : 09/812288 | |
| DATED | : May 23, 2006 | |
| INVENTOR(S) | : Steve Campolo et al. | |

It is certified that error appears in the above-identified patent and that said Letters Patent is hereby corrected as shown below:

Column 16, line 55, (in claim 1) after the word "of:" insert in paragraph form the phrase --manufacturing said circuit interrupting device in a reset lockout state;--, Column 18, line 49, (in claim 6) change "steam" to --stream--.

Signed and Sealed this

Nineteenth Day of September, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,049,910 B2 |
| APPLICATION NO. | : 09/812288 |
| DATED | : May 23, 2006 |
| INVENTOR(S) | : Campolo et al. |

It is certified that error appears in the above-identified patent and that said Letters Patent is hereby corrected as shown below:

Column 18, line 19 (line 7 of Claim 6), after the word "a" please change "ripped" to correctly read: --tripped--.

Signed and Sealed this

Twenty-eighth Day of August, 2007

JON W. DUDAS
*Director of the United States Patent and Trademark Office*